(12) United States Patent
Luo et al.

(10) Patent No.: US 9,202,866 B2
(45) Date of Patent: Dec. 1, 2015

(54) SEMICONDUCTOR DEVICE AND FORMATION THEREOF

(71) Applicant: Taiwan Semiconductor Manufacturing Company Limited, Hsin-Chu (TW)

(72) Inventors: Cheng-Wei Luo, Hsinchu (TW); Hsiao-Tsung Yen, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/150,250

(22) Filed: Jan. 8, 2014

(65) Prior Publication Data

US 2015/0194486 A1   Jul. 9, 2015

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 29/06* (2006.01)
*H01L 27/08* (2006.01)
*H01L 23/48* (2006.01)
*H01L 21/768* (2006.01)
*H01L 27/088* (2006.01)

(52) U.S. Cl.
CPC ...... *H01L 29/0657* (2013.01); *H01L 21/76897* (2013.01); *H01L 23/481* (2013.01); *H01L 27/0802* (2013.01); *H01L 27/0805* (2013.01); *H01L 27/088* (2013.01)

(58) Field of Classification Search
CPC .............. H01L 27/2454; H01L 27/11273; H01L 29/4236; H01L 29/66704
USPC .................................. 257/328, 329
See application file for complete search history.

(56) References Cited

U.S. PATENT DOCUMENTS 8,362,591 B2   1/2013 Yen et al.
2011/0127605 A1*  6/2011 Kim .............................. 257/334

* cited by examiner

*Primary Examiner* — Hoai V Pham
(74) *Attorney, Agent, or Firm* — Cooper Legal Group, LLC

(57) ABSTRACT

A semiconductor device and methods of formation are provided herein. A semiconductor device includes a conductor concentrically surrounding an insulator, and the insulator concentrically surrounding a column. The conductor, the insulator and the conductor are alternately configured to be a transistor, a resistor, or a capacitor. The column also functions as a via to send signals from a first layer to a second layer of the semiconductor device. The combination of via and at least one of a transistor, a capacitor, or a resistor in a semiconductor device decreases an area penalty as compared to a semiconductor device that has vias formed separately from at least one of a transistor, a capacitor, or resistor.

20 Claims, 22 Drawing Sheets

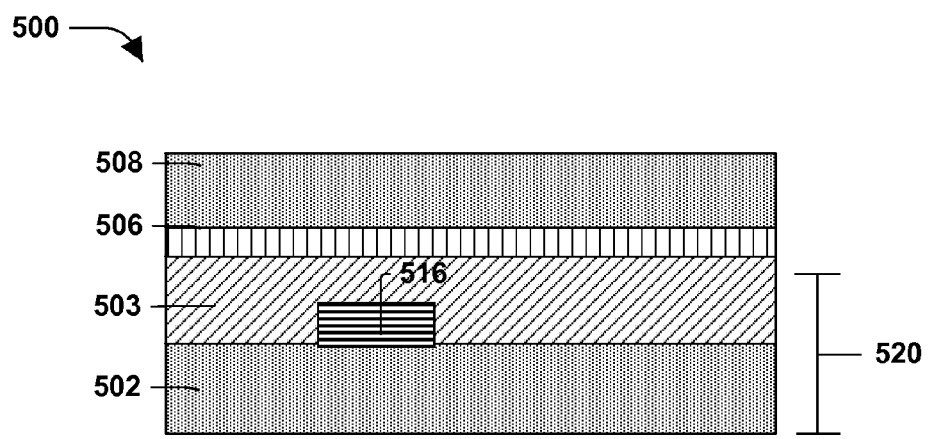

SEMICONDUCTOR DEVICE AND FORMATION THEREOF

BACKGROUND

Semiconductor devices include, among other things, transistors and capacitors, where transistors function as switches and capacitors store electrical charge.

DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is an illustration of a semiconductor device, in accordance with some embodiments.

FIG. 9 is an illustration of a semiconductor device, in accordance with some embodiments.

FIG. 10 is an illustration of a semiconductor device, in accordance with some embodiments.

DETAILED DESCRIPTION

Figure 1:
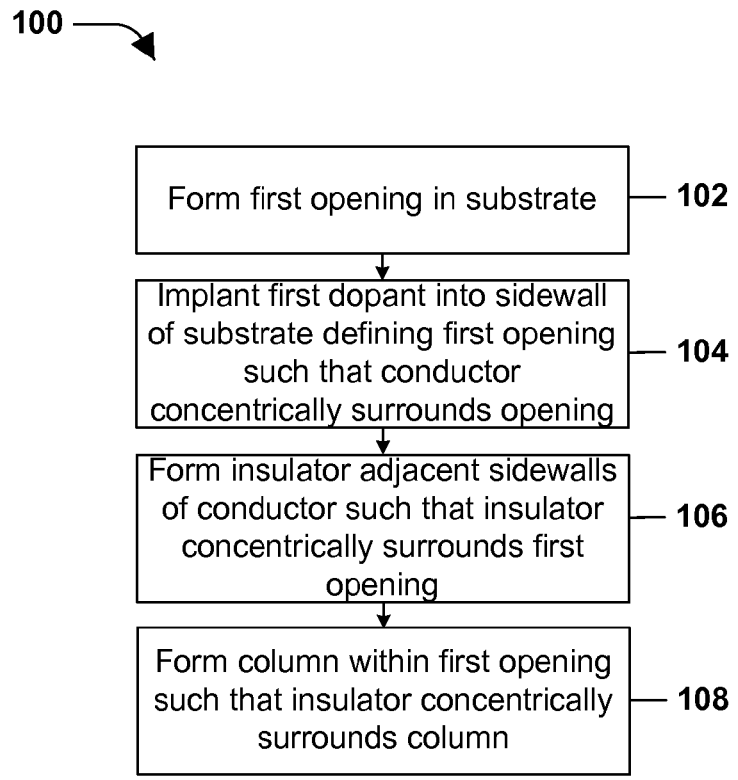
FIG. 1 is a flow diagram illustrating a method of forming a semiconductor device, in accordance with some embodiments.

The following disclosure provides many different embodiments, or examples, for implementing different features of the invention. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 13:
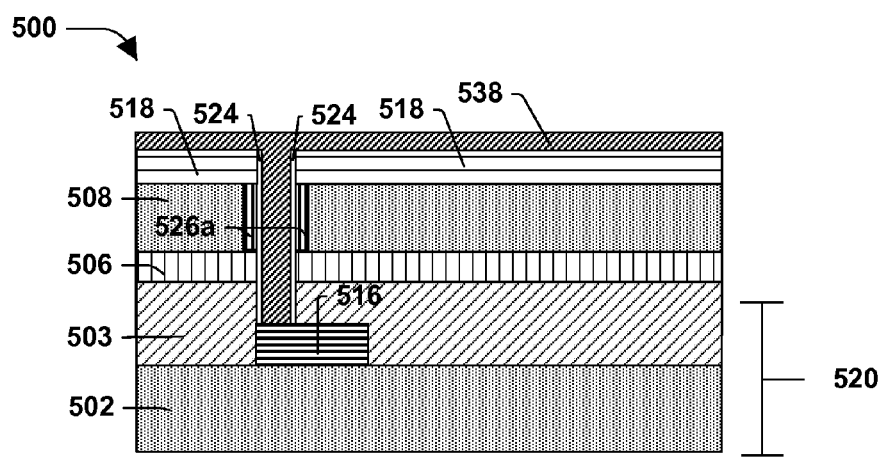
FIG. 13 is an illustration of a semiconductor device, in accordance with some embodiments.
Figure 14:
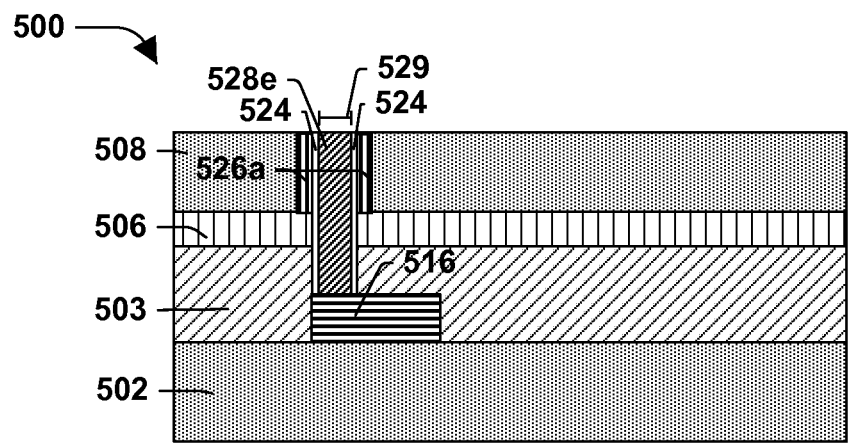
FIG. 14 is an illustration of a semiconductor device, in accordance with some embodiments.
Figure 15:
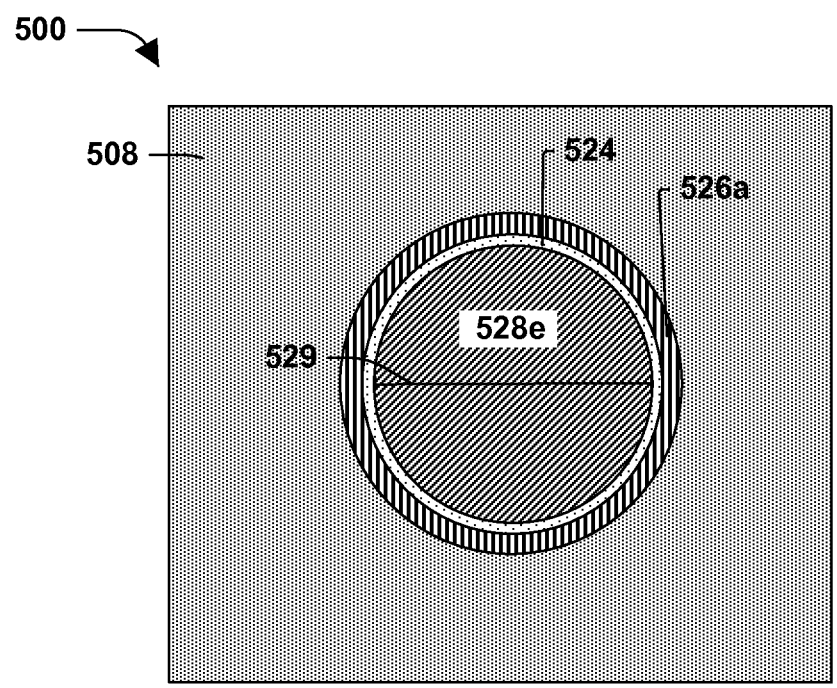
FIG. 15 is an illustration of a semiconductor device, in accordance with some embodiments.
Figure 19:
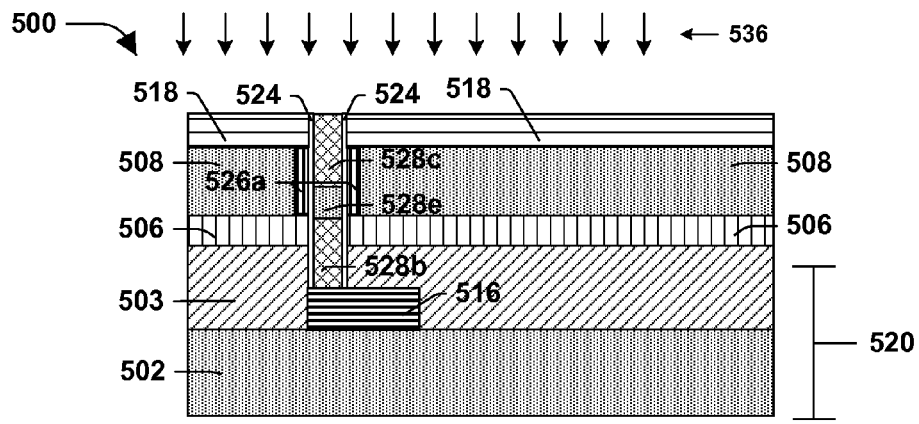
FIG. 19 is an illustration of a semiconductor device, in accordance with some embodiments.
Figure 20:
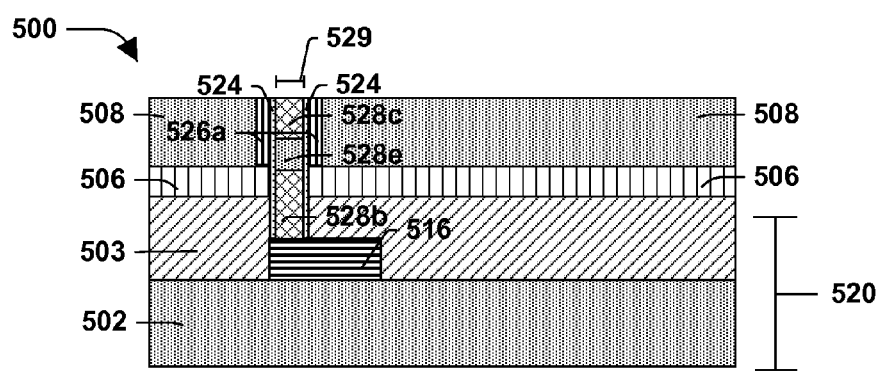
FIG. 20 is an illustration of a semiconductor device, in accordance with some embodiments.
Figure 21:
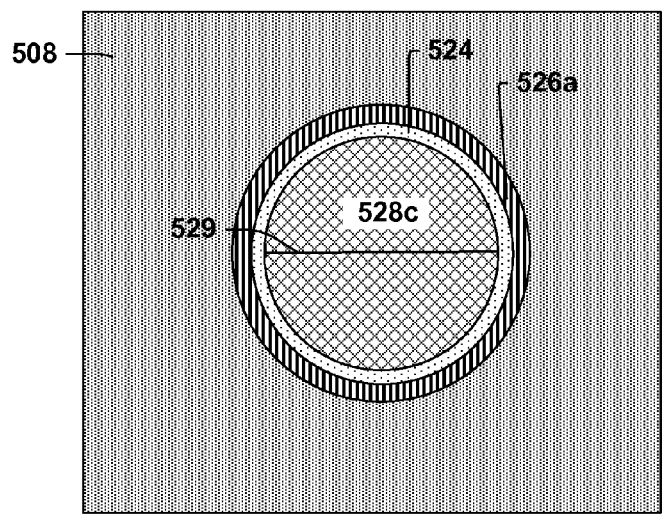
FIG. 21 is an illustration of a semiconductor device, in accordance with some embodiments.
Figure 22:
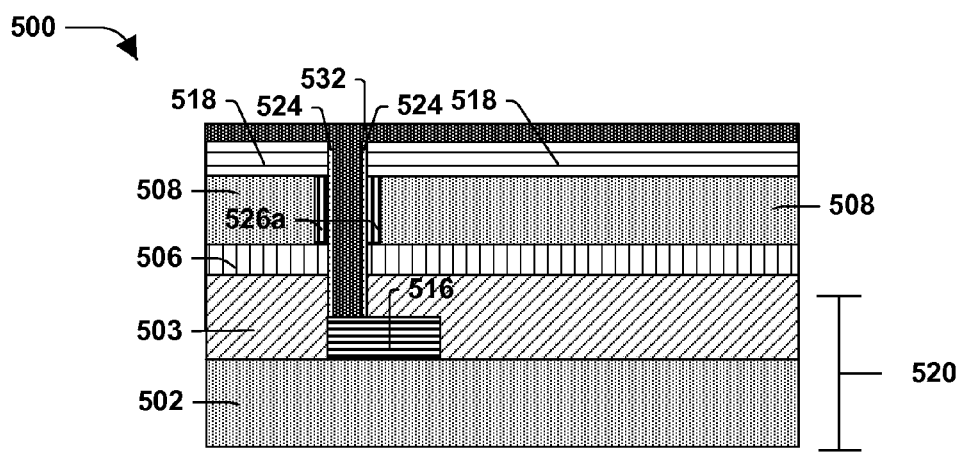
FIG. 22 is an illustration of a semiconductor device, in accordance with some embodiments.
Figure 23:
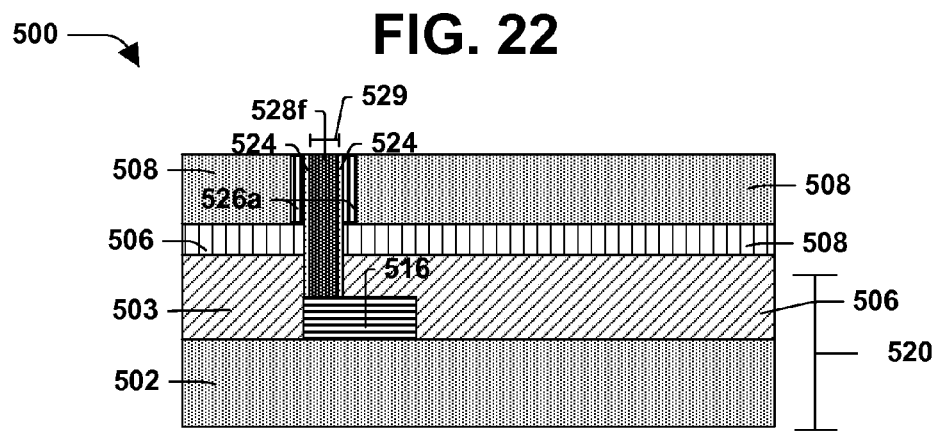
FIG. 23 is an illustration of a semiconductor device, in accordance with some embodiments.
Figure 24:
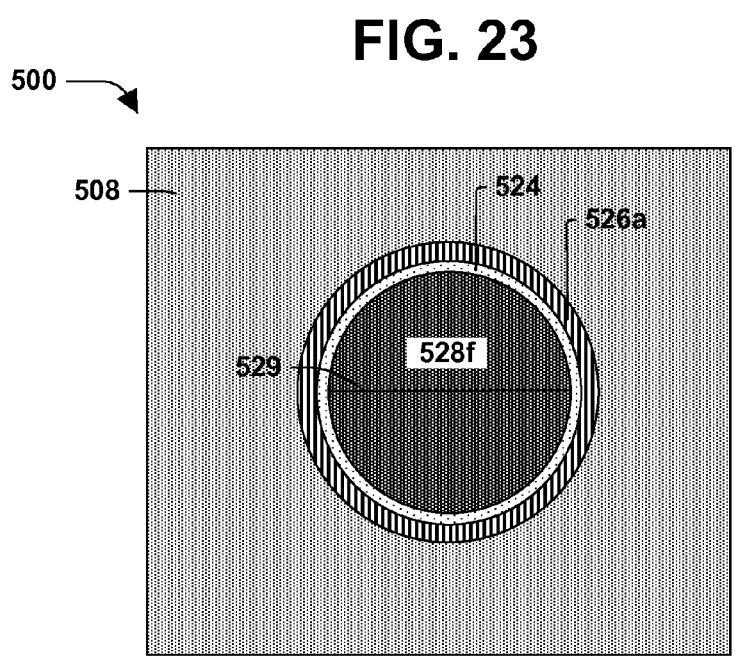
FIG. 24 is an illustration of a semiconductor device, in accordance with some embodiments.

A method 100 of forming a semiconductor device 500 according to some embodiments is illustrated in FIG. 1 and one or more structures formed thereby at various stages of fabrication are illustrated in FIGS. 5-24. According to some embodiments, as illustrated in FIGS. 14-15, 20-21, and 23-24, the semiconductor device 500 comprises a column 528, an insulator 524 and a conductor 526, where the insulator 524 concentrically surrounds the column 528, and the conductor 526 concentrically surrounds the column 528. In some embodiments, the column 528 is configured as a column channel 528e and the conductor 526 is configured as a conductor gate 526a, such that the semiconductor device 500 comprises a transistor, as illustrated in FIGS. 14-15. In some embodiments, the column 528 is configured as a column drain 528c, the column channel 528e, and a column source 528b, where the column channel 528e is between the column drain 528c and the column source 528b, and the conductor 526 is configured as the conductor gate 526a, such that the semiconductor device 500 comprises a transistor, as illustrated in FIGS. 20-21. In some embodiments, the column 528 is configured as a column resistor 528f and the conductor 526 is configured as the conductor gate 526a, such that the semiconductor device 500 comprises a resistor, as illustrated in FIGS. 23-24. Although concentric is routinely mentioned herein, the same is not meant to be limiting to merely circular configurations. Rather, features, elements, columns, etc. that are said to concentrically surround, be concentrically surrounded or the like have cross sectional dimensions, configurations, etc. that are other than circular, according to some embodiments. A column, opening, etc. thus has a square, rectangular, octagonal, elliptical, etc. cross section, according to some embodiments. Accordingly, although round, columnar, etc. dimensions are discussed, illustrated, etc., the instant disclosure, including the scope of the appended claims is not to be so limited. Rather, other configurations are contemplated.

Figure 5:
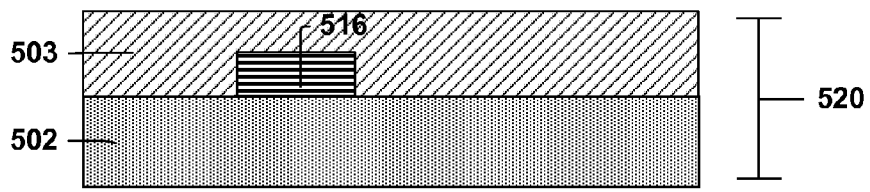
FIG. 5 is an illustration of a semiconductor device, in accordance with some embodiments.
Figure 6:
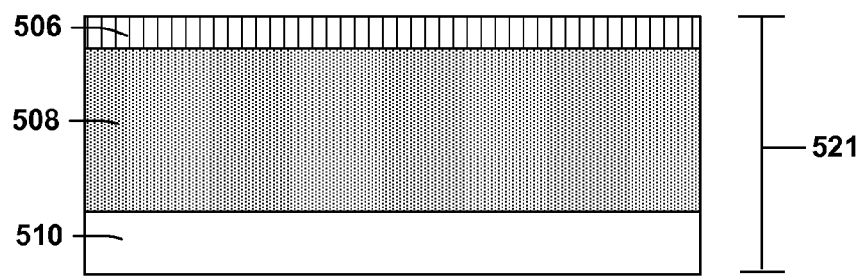
FIG. 6 is an illustration of a semiconductor device, in accordance with some embodiments.
Figure 7:
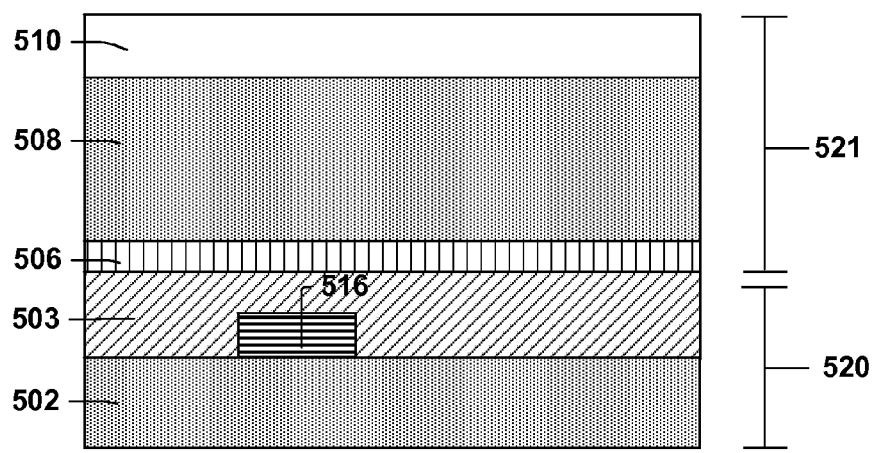
FIG. 7 is an illustration of a semiconductor device, in accordance with some embodiments.

At 102, a first opening 514 is formed in a substrate 508, as illustrated in FIG. 9. Prior to FIG. 9, according to some embodiments, a conductor 516 is over a base substrate 502, as illustrated in FIG. 5. In some embodiments, the conductor 516 is formed by at least one of depositing or growing a layer of conductive material and then patterning the layer of conductive material, such as by etching. In some embodiments, a first dielectric layer 503 is then formed over the conductor 516, such as by at least one of growth or deposition to form a first semiconductor composite 520. In some embodiments, the first dielectric layer 503 comprises at least one of silicon oxide ($SiO_2$) or silicon nitride ($Si_3N_4$). In some embodiments, the conductor 516 has a thickness of between about 0.1 µm to about 4.0 µm. In some embodiments, a second semiconductor composite 521 comprising a glue oxide 506, a substrate 508, and a top substrate 510, as illustrated in FIG. 6, is inverted and placed over the first semiconductor composite 520, as illustrated in FIG. 7. In some embodiments, at least one of the base substrate 502, the substrate 508 or the top substrate 510 have a thickness of between about 200 µm to about 700 µm. In some embodiments, at least one of the base substrate 502, the substrate 508, the top substrate 510 or other substrates mentioned herein comprise an epitaxial layer, a silicon-on-insulator (SOI) structure, a wafer, or a die formed from a wafer. In some embodiments, at least one of the base substrate 502, the substrate 508, the top substrate 510 or other substrates mentioned herein comprise at least one of silicon, silicon-germanium (SiGe) or polysilicon. In some embodiments, the glue oxide 506 adheres the substrate 508 to the first dielectric layer 503. In some embodiments, the glue oxide 506 comprises an oxide. In some embodiments, the glue oxide 506 has a thickness of between about 10 µm to about 40 µm. In some embodiments, the top substrate 510 and a portion of the substrate 508 are removed, such as with $H_2$ or He, as illustrated in FIG. 8. In some embodiments, a horizontal or lateral fracture is introduced in the substrate 508 to remove the portion of the substrate, such as where the portion of the substrate 508 that is removed corresponds to a portion of the substrate 508 above the fracture in a direction away from the base substrate 502 and towards the top substrate 510. In some embodiments, a first mask 518 is formed over the substrate 508, such that a portion of the substrate 508 over the conductor 516 is exposed as illustrated in FIG. 9. In some embodiments, the first opening 514 is formed in the substrate 508 over the conductor 516, such that at least of portion of the top surface 515 of the conductor 516 is exposed.

At 104, a first dopant 522 is implanted into a sidewall of the substrate 508 defining the first opening 514 to from a conductor 526, such that the conductor 526 concentrically surrounds the first opening 514, as illustrated in FIG. 10, according to some embodiments. In some embodiments, the conductor 526 is configured as a conductor gate 526a. In some embodiments, the conductor gate 526a comprises at least one of a polysilicon or doped silicon.

Figure 11:
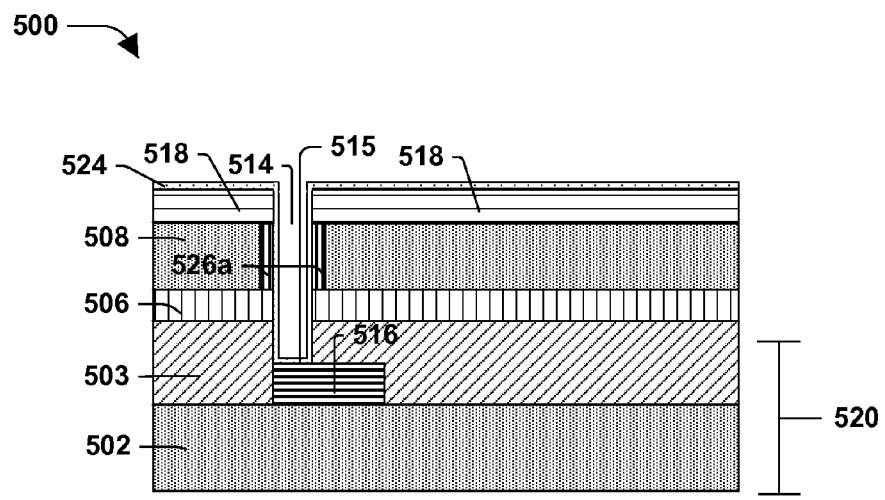
FIG. 11 is an illustration of a semiconductor device, in accordance with some embodiments.
Figure 12:
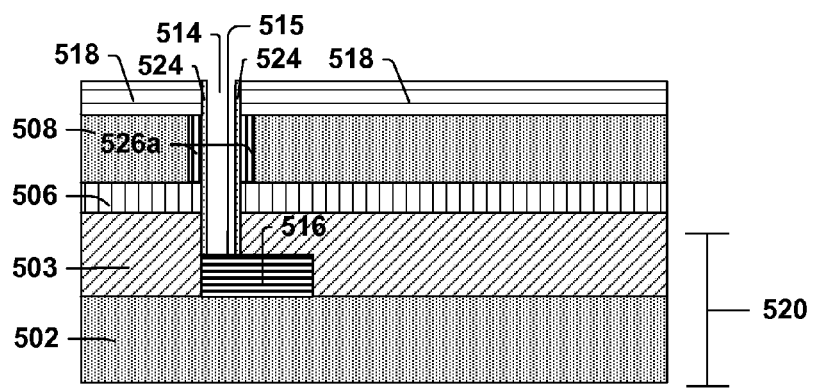
FIG. 12 is an illustration of a semiconductor device, in accordance with some embodiments.

At 106, an insulator 524 is formed adjacent the sidewalls of the conductor gate 526a, such that the insulator 524 surrounds the first opening 514, as illustrated in FIG. 12. Prior to FIG. 12, according to some embodiments, the insulator 524 is formed in the first opening 514, and over the first mask 518, as illustrated in FIG. 11. In some embodiments, the insulator 524 comprises a high dielectric constant material such as an oxide. In some embodiments, the insulator 524 has a thickness of between about 0.002 µm to about 2.0 µm. In some embodiments, the insulator 524 is formed by deposition. In some embodiments, the insulator 524 is removed, such as by at least one of chemical mechanical planarization (CMP) or dry etching, from the over the first mask 518 and the top surface 515 of the conductor 516, as illustrated in FIG. 12.

Figure 16:
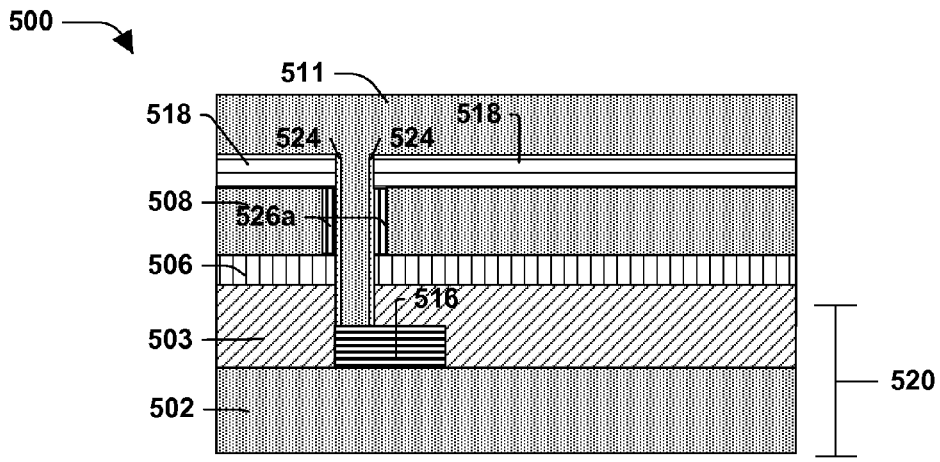
FIG. 16 is an illustration of a semiconductor device, in accordance with some embodiments.
Figure 17:
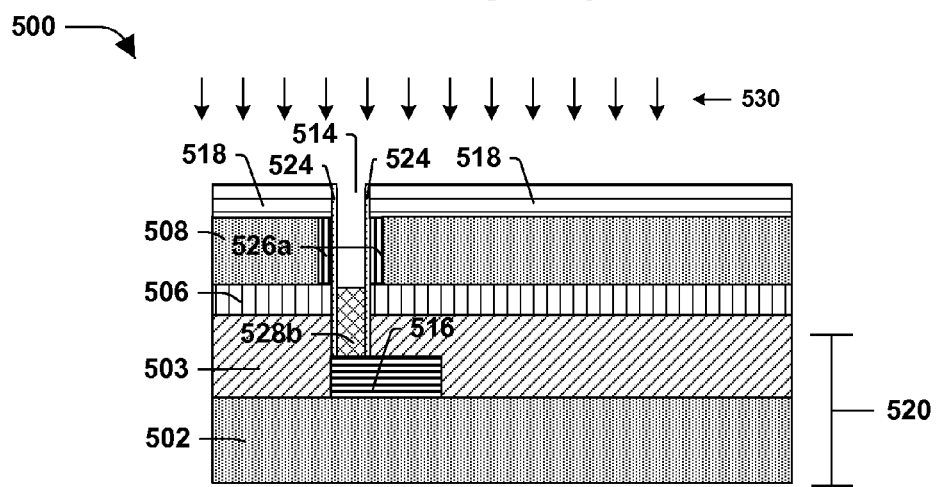
FIG. 17 is an illustration of a semiconductor device, in accordance with some embodiments.
Figure 18:
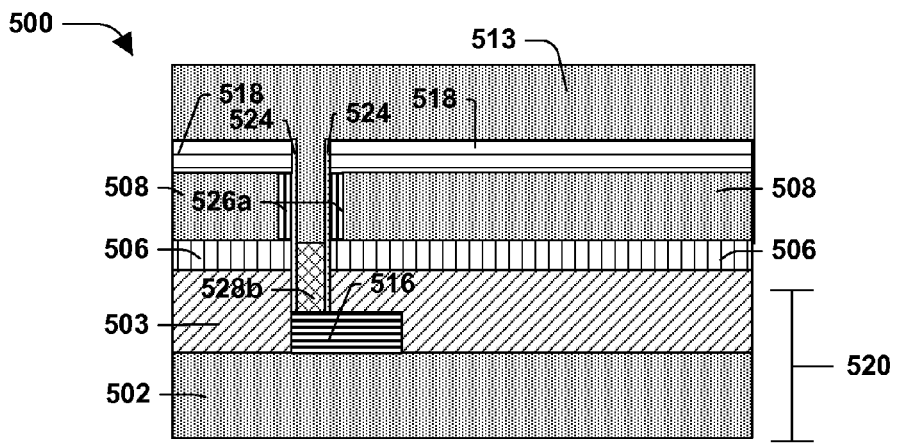
FIG. 18 is an illustration of a semiconductor device, in accordance with some embodiments.

At 108, a column 528 is formed in the first opening 514, such that the insulator 524 concentrically surrounds the column 528, as illustrated in FIGS. 14, 20 and 23, according to some embodiments. In some embodiments, the column 528 is configured as a column channel 528e, as illustrated in FIGS. 14-15, as a column source 528b, a column drain 528c, and a column channel 528e, where the column channel 528e is between the column source 528b and the column drain 528c, as illustrated in FIGS. 16-21 or as a column resistor 528f, as illustrated in FIGS. 22-24. Turning to FIG. 13, a first conductive material 538 is formed, such as by deposition, in the first opening 514 and over the first mask 518. In some embodiments, the first conductive material 538 comprises at least one of polysilicon or doped silicon. In some embodiments, the column channel 528e is formed such that the column channel 528e is in contact with the conductor 516. In some embodiments, the excess first conductive material 538 and the first mask 518 are removed, such as by CMP to form the column channel 528e, as illustrated in FIG. 14. In some embodiments, the column channel 528e has a column width 529 between about 0.5 µm to about 5.0 µm. Turning to FIG. 15, which illustrates a top down or overview of FIG. 14, according to some embodiments, where the top down or overview has a higher level of zoom than the side views, the conductor gate 526a concentrically surrounds the insulator 524, and the insulator 524 concentrically surrounds the column channel 528e. In some embodiments, the conductor 516 is connected to a power source (not shown), such that when a bias is applied to the conductor gate 526a, current from the power source flows through the column channel 528e. In some embodiments, the column channel 528 is connected to the conductor 516 and at least one of a via, a transistor, a capacitor, or a resistor. Turning to FIG. 16, which illustrates an initial stage of the formation of the column 528 configured as a column source 528b, a column drain 528c, and a column channel 528e, where the column channel 1528e is between the column source 528b and the column drain 528c, according to some embodiments. In some embodiments, a second material 511 is formed in the first opening 514 and over the first mask 518, such that the second material 511 is in contact with the top surface 515 of the conductor 516, according to some embodiments. In some embodiments, the second material 511 comprises at least one of silicon or germanium. In some embodiments, a portion of the second material 511 is removed, such as by at least one of CMP or etching, to form a second material portion where the second material 511 portion has a second material height that is less than a column height of the column 528. In some embodiments, a second dopant 530 is implanted into the second material portion to form the column source 528b, as illustrated in FIG. 17. In some embodiments, the second dopant 530 comprises at least one of p-type dopant, such as boron or an n-type dopant, such as phosphorus. In some embodiments, a third material 513 is formed in the first opening 514 over the conductor source 528b and over the first mask 518, as illustrated in FIG. 18. In some embodiments, the second material 511 and the third material 515 are the same material. In some embodiments, the third material 513 comprises at least one of silicon or germanium. In some embodiments, a portion of the third material 513 is removed, such as by CMP, to form a third material 513 portion where the third material 513 portion has a third material height that is less than a column height of the column 528. In some embodiments, a third dopant 536 is implanted into the third material 515 portion to form the column drain 528c, such that a column channel 528e is formed between the column source 528b and the column drain 528c to form a transistor, as illustrated in FIG. 19. In some embodiments, the third dopant 536 comprises at least one of p-type dopant, such as boron or an n-type dopant, such as phosphorus. In some embodiments, the excess column drain 528c and the first mask are removed, such as by CMP, as illustrated in FIG. 20. In some embodiments, the column 528 has a column width 529 between about 0.5 µm to about 5.0 µm. Turning to FIG. 21, which illustrates a top down or overview of FIG. 20, according to some embodiments, where the top down or overview has a higher level of zoom than the side views, the conductor gate 526a concentrically surrounds the insulator 524, and the insulator 524 concentrically surrounds the column drain 528c, which is over the column channel 528e, and the column source 528b. In some embodiments, the conductor 516 is connected to a power source (not shown), such that when a bias is applied to the conductor gate 526a, current from the power source flows through the column source 528b through the column channel 528e and out of the column drain 528c. In some embodiments, at least one of the column source 528b or the column drain 528c is connected to the conductor 516 and at least one of the column source 528b or the column drain 528c is connected to at least one of a via, transistor, capacitor, or resistor. Turning to FIG. 22, which illustrates an initial stage of the formation of the column 528 configured as the column resistor 528f, according to some embodiments. In some embodiments, a high resistance material 532, such as undoped silicon or low doped silicon, is formed, such as by deposition, in the first opening 514 and over the first mask 518. In some embodiments, the high resistance material 532 comprises at least one of undoped silicon or low doped silicon. In some embodiments, the column resistor 528f is formed such that the column resistor 528f is in contact with the conductor 516. In some embodiments, the excess high resistance material 532 and the first mask are removed, such as by CMP, to form a resistor, as illustrated in FIG. 23. Turning to FIG. 24, which illustrates a top down or overview of FIG. 23, according to some embodiments, where the top down or overview has a higher level of zoom than the side views, the conductor gate 526a concentrically surrounds the insulator 524, and the insulator 524 concentrically surrounds the column resistor 528f. In some embodiments, the conductor 516 is connected to a power source (not shown), such that when a bias is applied to the conductor gate 526a, current from the power source flows through the column resistor 528f. In some embodiments, the column resistor 528f is connected to the conductor 516 and at least one of a via, a transistor, a capacitor, or a resistor.

Figure 2:
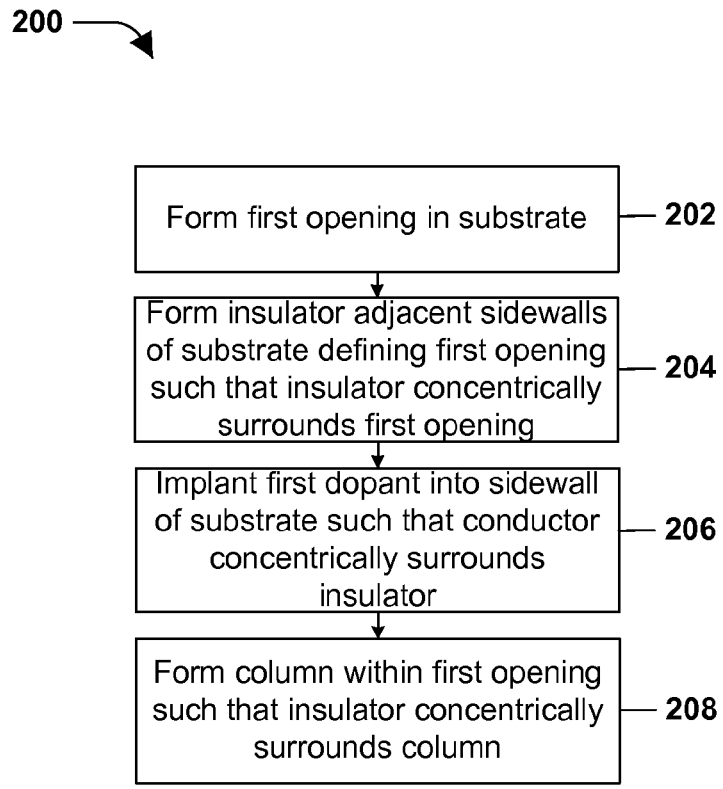
FIG. 2 is a flow diagram illustrating a method of forming a semiconductor device, in accordance with some embodiments.
Figure 31:
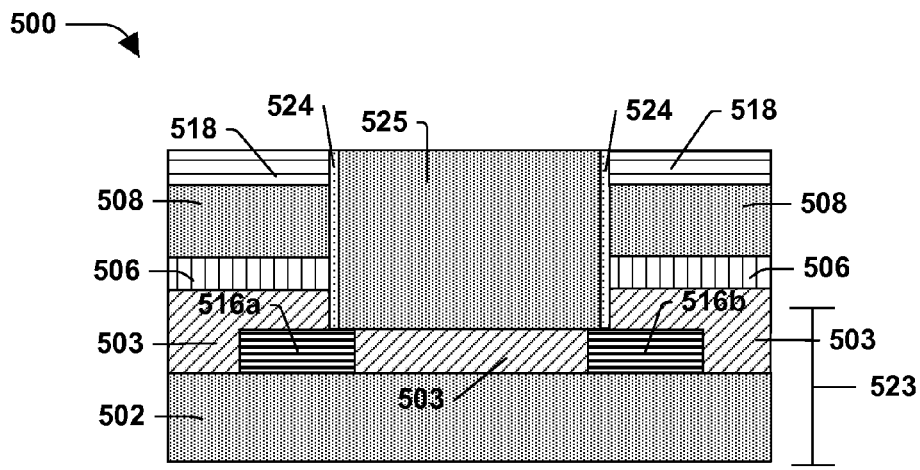
FIG. 31 is an illustration of a semiconductor device, in accordance with some embodiments.
Figure 32:
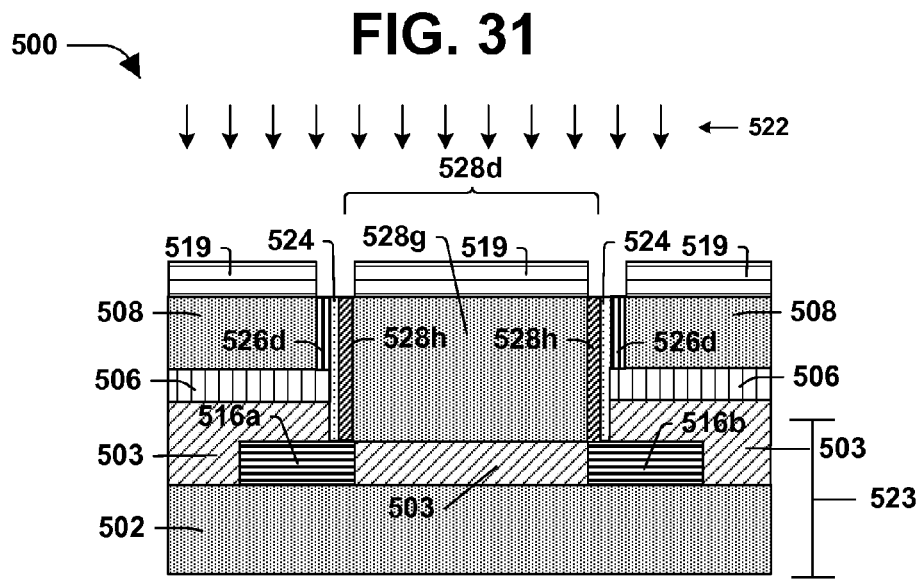
FIG. 32 is an illustration of a semiconductor device, in accordance with some embodiments.
Figure 33:
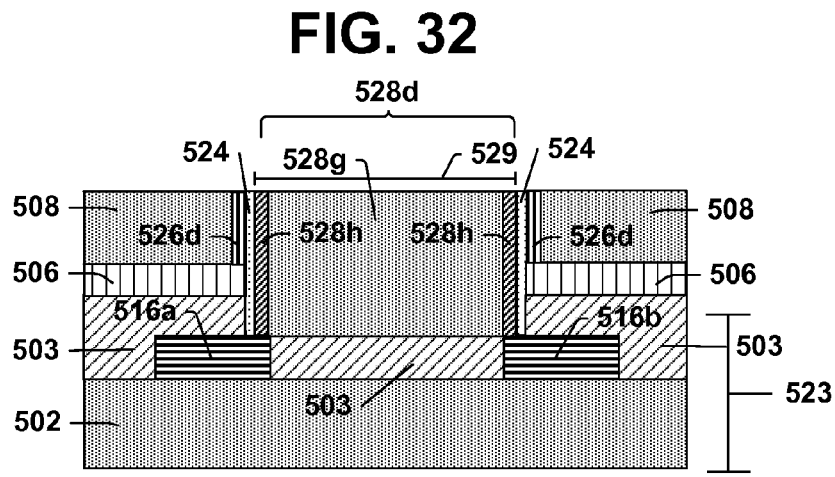
FIG. 33 is an illustration of a semiconductor device, in accordance with some embodiments.

A method 200 of forming a semiconductor device 500 according to some embodiments is illustrated in FIG. 2 and one or more structures formed thereby at various stages of fabrication are illustrated in FIGS. 25-34. In some embodiments, a semiconductor device 500 comprises a column 528, the column comprising a column inner portion 528g and a column outer portion 528h, an insulator 524 and a conductor 526, where the insulator 524 concentrically surrounds the column 528, and the conductor 526 concentrically surrounds the insulator 524, as illustrated in FIG. 33. In some embodiments, the column 528 is configured as a column capacitive plate 528d and the conductor 526 is configured as a conductor capacitive plate 526d.

Figure 25:
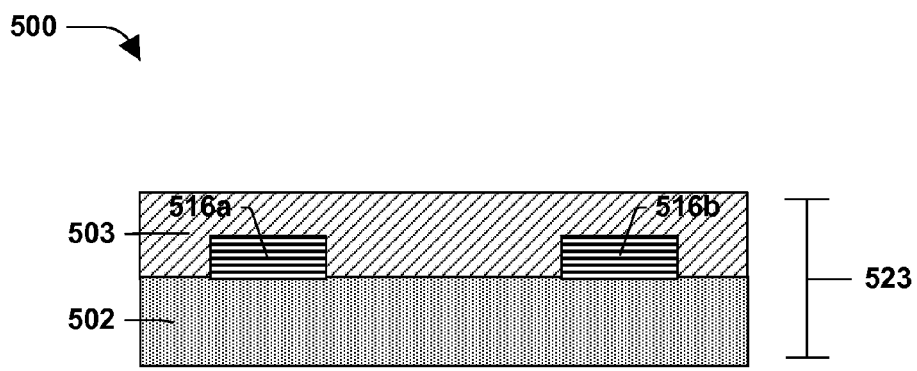
FIG. 25 is an illustration of a semiconductor device, in accordance with some embodiments.
Figure 26:
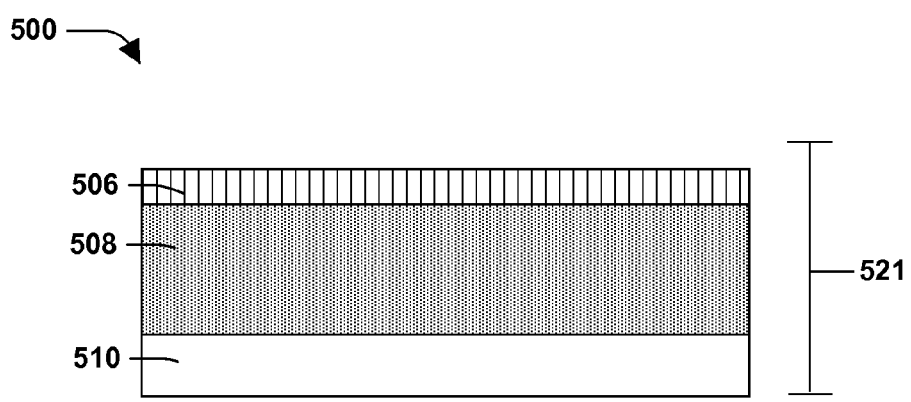
FIG. 26 is an illustration of a semiconductor device, in accordance with some embodiments.
Figure 27:
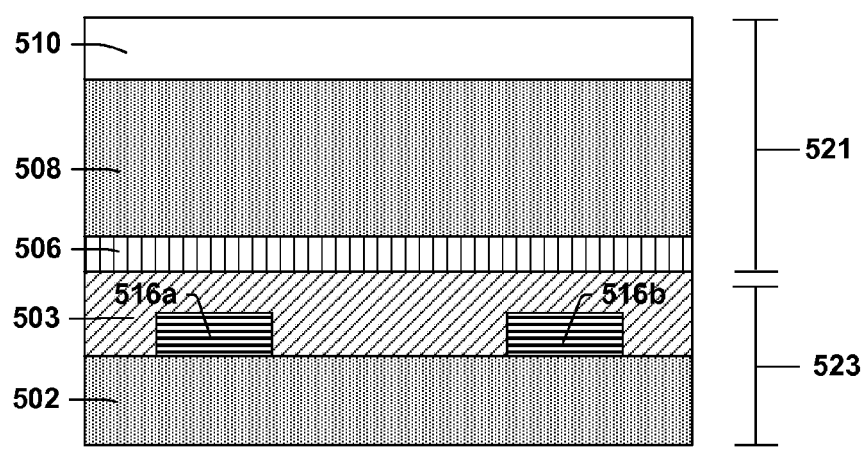
FIG. 27 is an illustration of a semiconductor device, in accordance with some embodiments.
Figure 28:
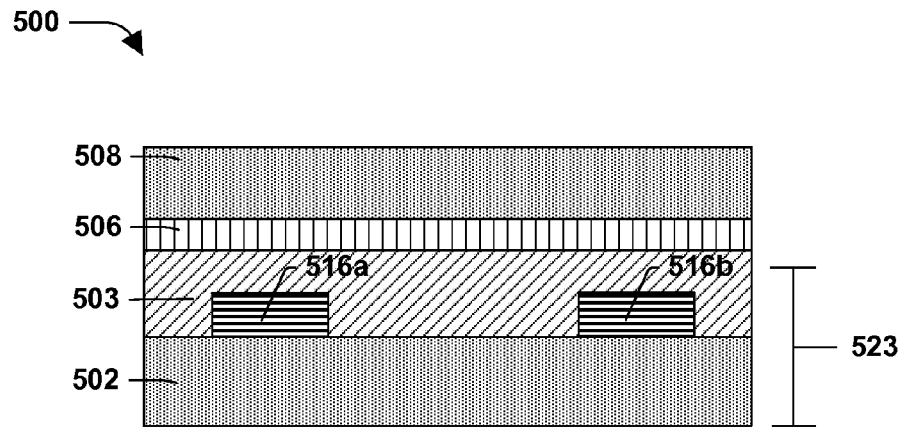
FIG. 28 is an illustration of a semiconductor device, in accordance with some embodiments.
Figure 29:
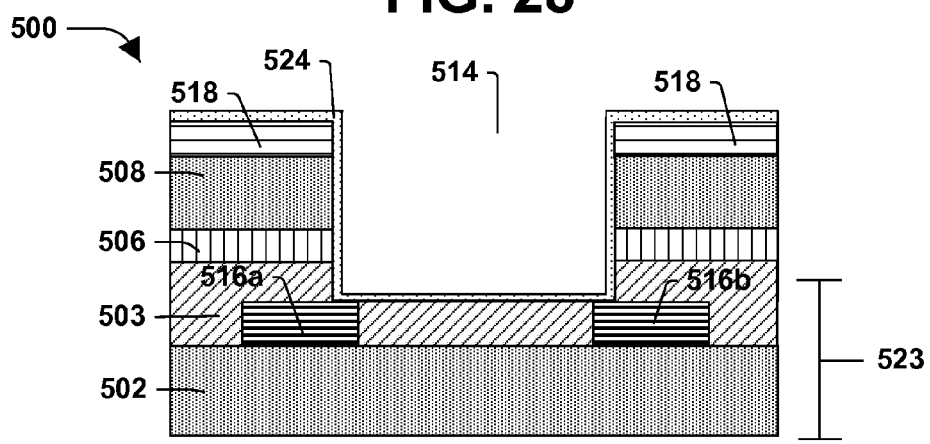
FIG. 29 is an illustration of a semiconductor device, in accordance with some embodiments.

At 202, an opening is formed in the substrate 508, as illustrated in FIG. 29. Prior to FIG. 29, according to some embodiments, a first conductor 516a and a second conductor 516b are over a base substrate 502, as illustrated in FIG. 25. In some embodiments, the first conductor 516a and the second conductor 516b are formed by at least one of depositing or growing a layer of conductive material and then patterning the layer of conductive material, such as by etching. In some embodiments, a first dielectric layer 503 is then formed over the first conductor 516a and the second conductor 516b, such as by at least one of growth or deposition to form a third semiconductor composite 523. In some embodiments, the first dielectric layer 503 comprises at least one of silicon oxide ($SiO_2$) or silicon nitride ($Si_3N_4$). In some embodiments, at least on of the first conductor 516a or the second conductor 516b has a thickness of between about 0.1 µm to about 4.0 µm. In some embodiments, a second semiconductor composite 521 comprising a glue oxide 506, a substrate 508, and a top substrate 510, as illustrated in FIG. 26, is inverted and placed over the third semiconductor composite 523, as illustrated in FIG. 27. In some embodiments, at least one of the base substrate 502, the substrate 508 or the top substrate 510 have a thickness of between about 200 µm to about 700 µm. In some embodiments, at least one of the base substrate 502, the substrate 508, the top substrate 510 or other substrates mentioned herein comprise an epitaxial layer, a silicon-on-insulator (SOI) structure, a wafer, or a die formed from a wafer. In some embodiments, at least one of the base substrate 502, the substrate 508, the top substrate 510 or other substrates mentioned herein comprise at least one of silicon, silicon-germanium (SiGe) or polysilicon. In some embodiments, the glue oxide 506 adheres the substrate 508 to the first dielectric layer 503. In some embodiments, the glue oxide 106 comprises an oxide. In some embodiments, the glue oxide 506 has a thickness of between about 10 µm to about 40 µm. In some embodiments, the top substrate 510 and a portion of the substrate 508 are removed, such as with $H_2$ or He, as illustrated in FIG. 28. In some embodiments, a horizontal or lateral fracture is introduced in the substrate 508 to remove the portion of the substrate, such as where the portion of the substrate 508 that is removed corresponds to a portion of the substrate 508 above the fracture in a direction away from the base substrate 502 and towards the top substrate 510. In some embodiments, a first mask 518 is formed over the substrate 508, such that a portion of the substrate 508 over the first conductor 516a and the second conductor 516b is exposed. In some embodiments, the first opening 514 is formed in the substrate 508 over a portion of the first conductor 516a and a portion of the second conductor 516b, such that at least a portion of the top surface 515 of the first conductor 516a and a top surface 515 of the second conductor 516b is exposed. In some embodiments, multiple conductors 516 are formed in the first dielectric layer 503.

Figure 30:
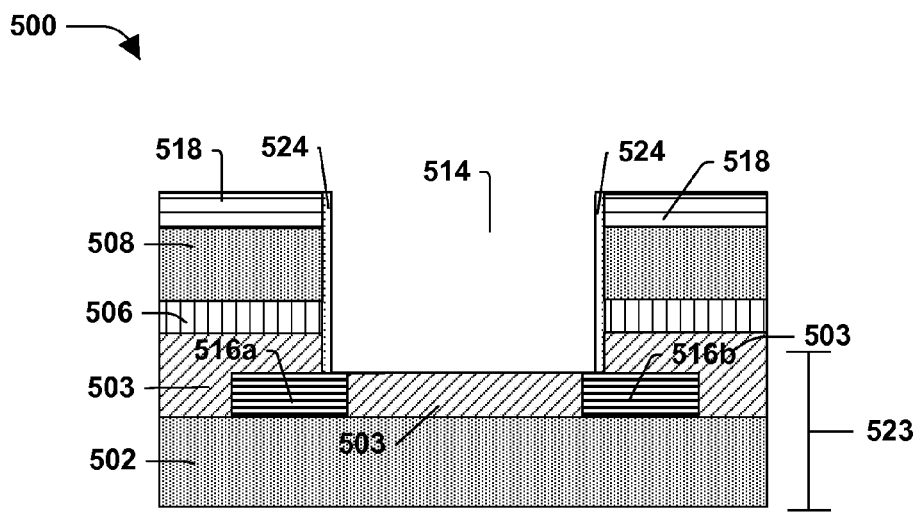
FIG. 30 is an illustration of a semiconductor device, in accordance with some embodiments.

At 204, an insulator 524 is formed adjacent the sidewalls of the substrate 508 defining the first opening 514, such that the insulator 524 surrounds the first opening 514, as illustrated in FIG. 30. Prior to FIG. 30, according to some embodiments, the insulator 524 is formed in the first opening 514, and over the first mask 518, as illustrated in FIG. 29. In some embodiments, the insulator 524 comprises a high dielectric constant material such as an oxide. In some embodiments, the insulator 524 has a thickness of between about 0.002 µm to about 2.0 µm. In some embodiments, the insulator 524 is formed by deposition. In some embodiments, the insulator 524 is removed, such as by at least one of chemical mechanical planarization (CMP) or dry etching, from the over the first mask 518 and the top surface 515 of the first conductor 516a and the top surface 515 of the second conductor 516b, as illustrated in FIG. 30. In some embodiments, a first material 525 is formed, such as by deposition, in the first opening 514, as illustrated in FIG. 31. In some embodiments, the first material 525 comprises at least one of silicon or germanium. In some embodiments, the first mask 518 is removed, such as by CMP, and a height of the first material 525 is reduced, such that the first material 525 is planer with the substrate 508. In some embodiments, a second mask 519 is formed over the substrate 508 and the first material 525, such that the second mask 519 is not over the insulator 524, as illustrated in FIG. 32.

At 206, a first dopant 522 is implanted into a sidewall of the substrate 508 defining the first opening 514 to form a conductor 526 configured as a conductive capacitive plate 528d, such that the conductive capacitive plate 528d concentrically surrounds the insulator 524, as illustrated in FIG. 32, according to some embodiments. In some embodiments, the conductor capacitive plate 526d comprises at least one of a polysilicon or doped silicon.

Figure 34:
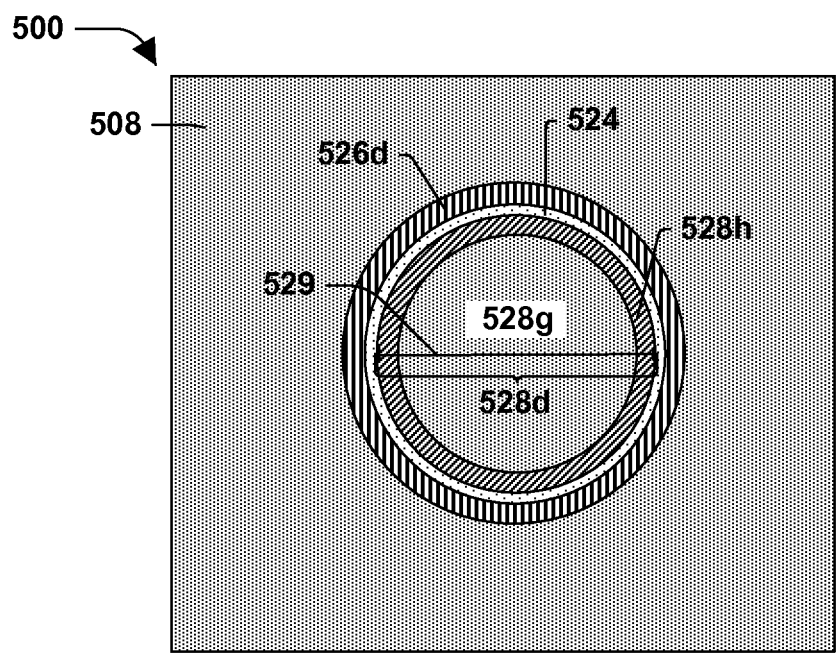
FIG. 34 is an illustration of a semiconductor device, in accordance with some embodiments.
Figure 35:
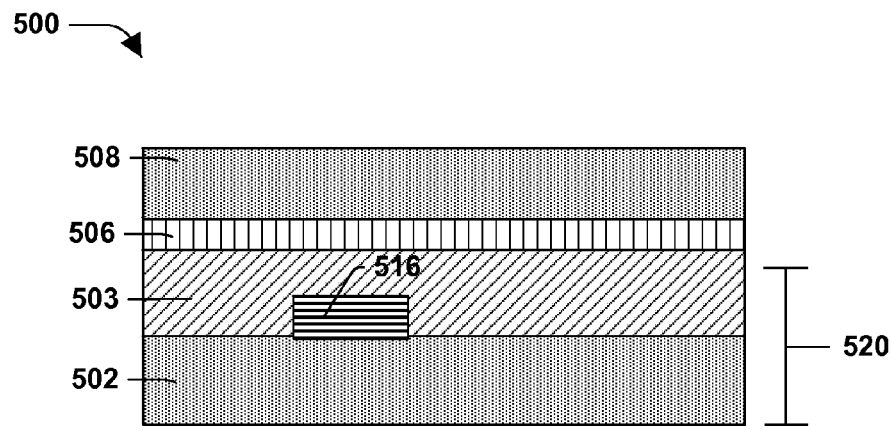
FIG. 35 is an illustration of a semiconductor device, in accordance with some embodiments.

At 208, the column 528 is formed in the first opening 514, as illustrated in FIG. 32. In some embodiments, the column 528 is configured as a column capacitive plate 528d. Prior to FIG. 32, according to some embodiments, the column inner portion 528g of the column capacitive plate 528d comprises the first material 525, as illustrated in FIG. 31. In some embodiments, the first dopant 522 is implanted adjacent the insulator 524 to form a column outer portion 528h. In some embodiments, the column outer portion 528h concentrically surrounds the column inner portion 528g, the insulator 524 concentrically surrounds the column outer portion 528h and the conductor capacitive plate 528d surrounds the insulator 524, which forms a capacitor. In some embodiments, the column outer portion 528h comprises at least one of a polysilicon or doped silicon. In some embodiments, the second mask 519 is removed such as by CMP, as illustrated in FIG. 33. Turning to FIG. 34, which illustrates a top down or overview of FIG. 33, according to some embodiments, where the top down or overview has a higher level of zoom than the side views, the conductor capacitive plate 526d concentrically surrounds the insulator 524, and the insulator 524 concentrically surrounds the column capacitive plate 528d. In some embodiments, at least one of the first conductor 516a or the second conductor 516b is connected to a power source (not shown), such that when a current is applied to the conductor capacitive plate 526d, current from the power source is stored. In some embodiments, the column capacitive plate 528d is connected to at least one of the first conductor 516a or the second conductor 516b and the conductor capacitive plate 526d is connected to at least one of a via, a transistor, a capacitor, or a resistor.

Figure 3:
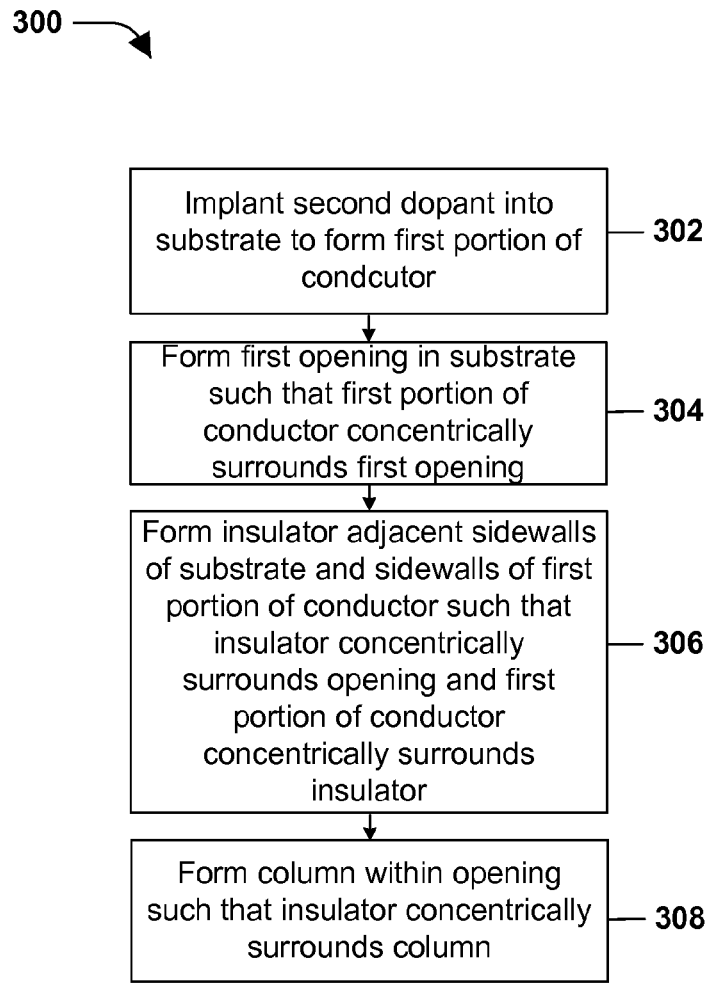
FIG. 3 is a flow diagram illustrating a method of forming a semiconductor device, in accordance with some embodiments.

A method 300 of forming a semiconductor device 500 according to some embodiments is illustrated in FIG. 3 and one or more structures formed thereby at various stages of fabrication are illustrated in FIGS. 35-45.

Figure 43:
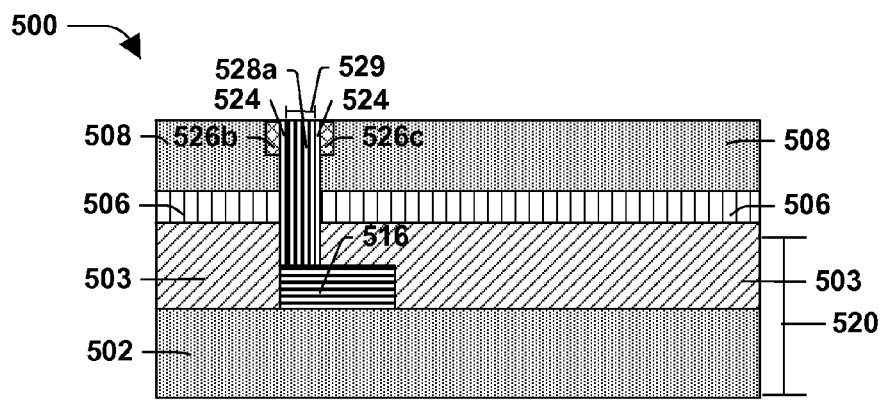
FIG. 43 is an illustration of a semiconductor device, in accordance with some embodiments.

In some embodiments, a semiconductor device 500 comprises a column 528, an insulator 524 and a first portion of a conductor 526, where the insulator 524 concentrically surrounds the column 528, and the first portion of the conductor 526 concentrically surrounds the insulator 524, as illustrated in FIG. 43. In some embodiments, the first portion of the conductor 526 has a first portion height, the first portion height is less than a column height of the column 528. In some embodiments, the column 528 is configured as a column gate 528a and the conductor 526 is configured as a conductor source 526b, a column drain 526c and a column channel 526e, such that the column source 526b and the column drain 526c are discontinuous.

Figure 36:
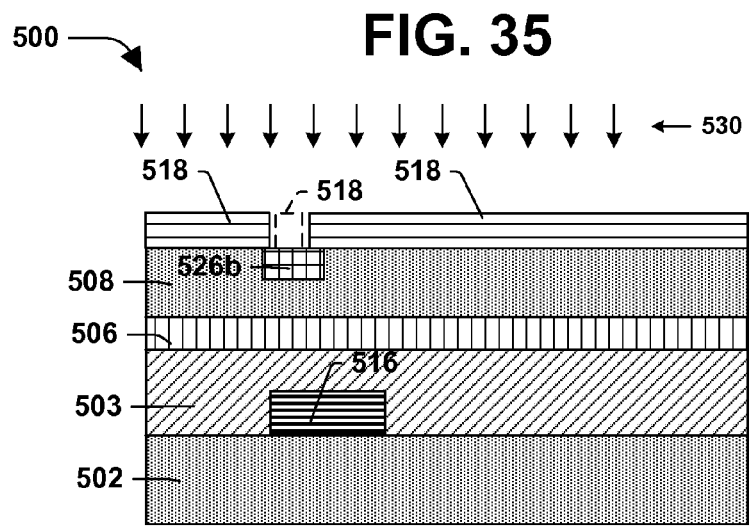
FIG. 36 is an illustration of a semiconductor device, in accordance with some embodiments.
Figure 37:
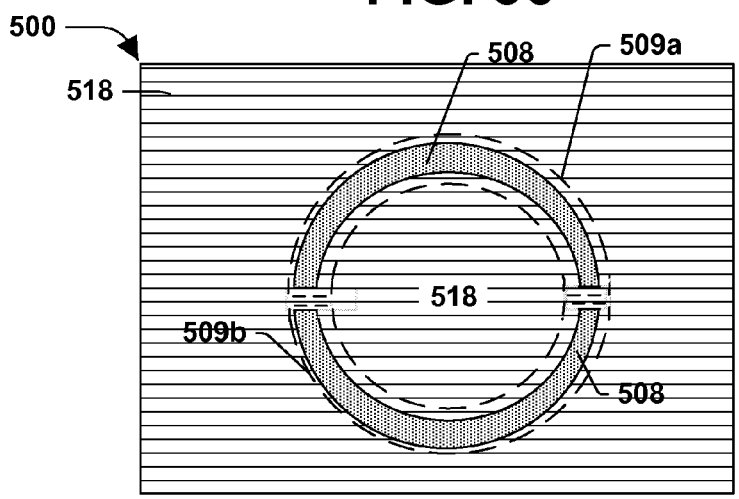
FIG. 37 is an illustration of a semiconductor device, in accordance with some embodiments.
Figure 38:
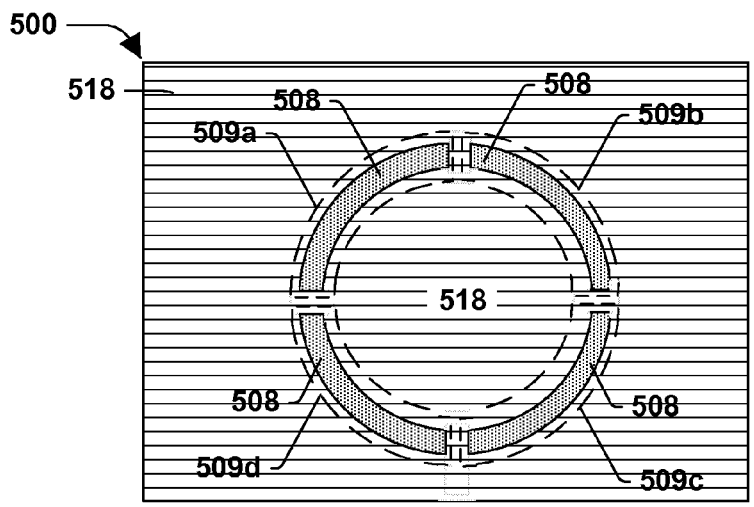
FIG. 38 is an illustration of a semiconductor device, in accordance with some embodiments.

At 302, a second dopant 530 is implanted into the substrate 508 to form a first portion of the conductor 526, as illustrated in FIG. 36. Prior to FIG. 36, according to some embodiments, the base substrate 502, the first dielectric layer 503, the conductor 516, the glue layer 506, and the substrate 508 are illustrated as in FIG. 35, which are formed as described above with regards to FIGS. 5-7. In some embodiments, a first mask 518 is formed over the substrate 508, such that the first mask 518 exposes a portion of the substrate 508 over the conductor 516, as illustrated in FIG. 36. In some embodiments, the second dopant 530 is implanted into the exposed substrate 508. In some embodiments, the second dopant 530 comprises at least one of p-type dopant, such as boron or an n-type dopant, such as phosphorus. In some embodiments, the second dopant 530 implant forms at least one of a conductor source 526b or a conductor drain 526c. Turning to FIG. 37, a top down or overview of FIG. 36 is illustrated. In some embodiment, the first mask 518 is configured such that first mask 518 exposes a first segment 509a of the substrate 508 and a second segment 509b of the substrate 508. In some embodiments, the second dopant 530 is implanted, such that the first segment 509a is configured as at least one of a conductor source 526b or a conductor drain 526c. In some embodiments, the second segment 509b is configured as the conductor source 526b if the first segment 509a is configured as the conductor drain 526c. In some embodiments, the second segment 509b is configured as the conductor drain 526c if the first segment 509a is configured as the conductor source 526b. Turning to FIG. 38, a top down or overview of FIG. 36 is illustrated. In some embodiment, the first mask 518 is configured such that first mask 518 exposes a first segment 509a of the substrate 508, a second segment 509b of the substrate 508, a third segment 509c of the substrate 508 and a fourth segment 509d of the substrate 508. In some embodiments, the second dopant 530 is implanted, such that the first segment 509a and the third segment 509c are configured as at least one of a conductor source 526b or a conductor drain 526c. In some embodiments, the second segment 509b and the fourth segment 509d are configured as conductor sources 526b if the first segment 509a and the third segment 509c are configured as conductor drains 526c. In some embodiments, the second segment 509b and the fourth segment 509d are configured as conductor drains 526c if the first segment 509a and the third segment 509c are configured as conductor sources 526b.

Figure 39:
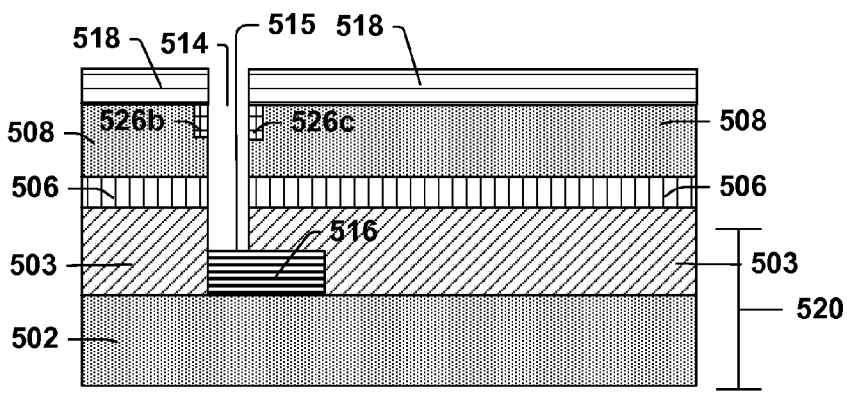
FIG. 39 is an illustration of a semiconductor device, in accordance with some embodiments.

At 304, a first opening 514 is formed in the substrate 508, such that the first portion of the conductor 526 surrounds the first opening 514, as illustrated in FIG. 39. In some embodiments, the first opening 514 is formed by etching. In some embodiments, the first opening 514 formation removes a portion of the first mask layer 518 over the conductor 516. In some embodiments, the first opening 514 exposes at least a portion of the top surface of the conductor 516. In some embodiments, the first opening 514 is surrounded by the conductor source 526b, the conductor drain 526c and the conductor channel 526e, such that the conductor channel 526e is between the conductor source 526b and the conductor drain 526c.

Figure 40:
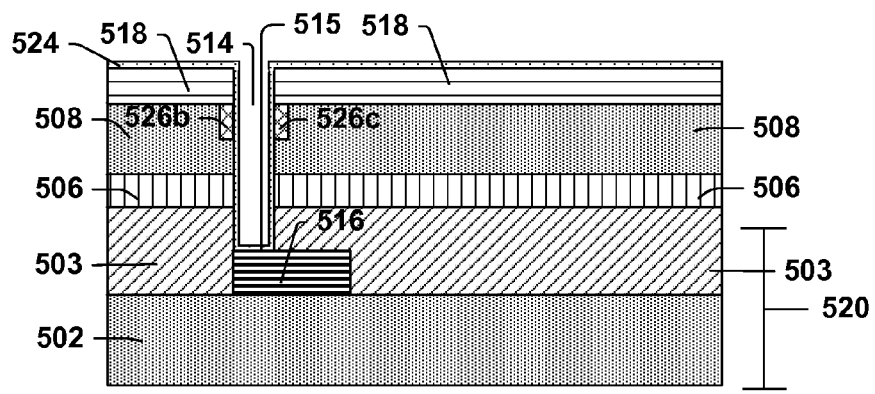
FIG. 40 is an illustration of a semiconductor device, in accordance with some embodiments.
Figure 41:
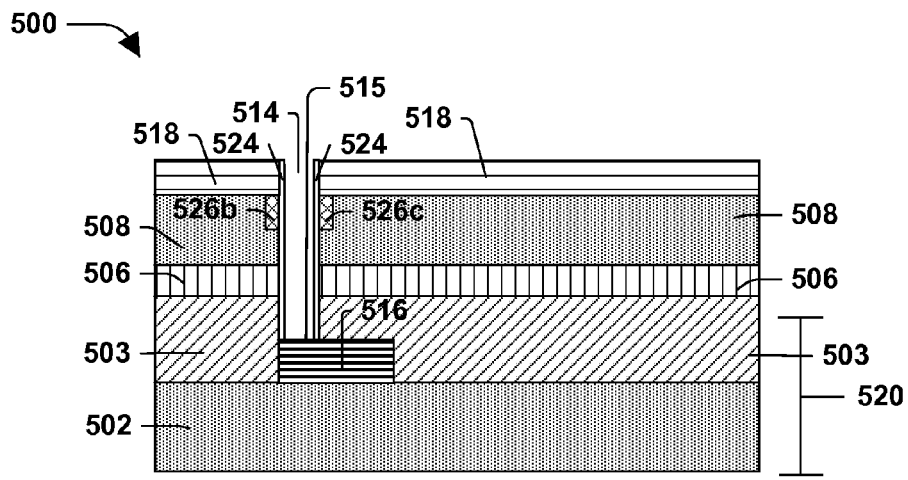
FIG. 41 is an illustration of a semiconductor device, in accordance with some embodiments.
Figure 42:
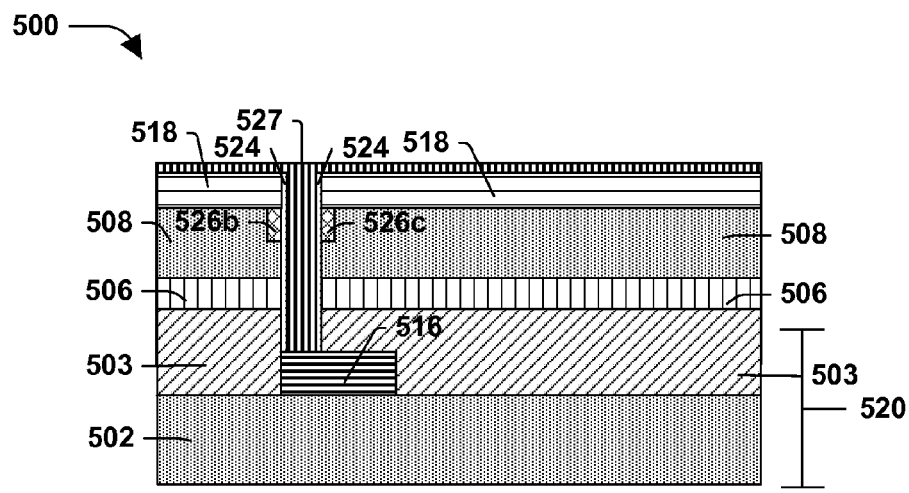
FIG. 42 is an illustration of a semiconductor device, in accordance with some embodiments.

At 306, an insulator 524 is formed adjacent the sidewalls of the substrate 508 defining the first opening 514 and sidewalls of the first portion of the conductor 526, such that the insulator 524 concentrically surrounds the first opening 514, as illustrated in FIG. 41. Prior to FIG. 41, according to some embodiments, the insulator 524 is formed in the first opening 514, over the first portion of the conductor 526, and over the first mask 518, as illustrated in FIG. 40. In some embodiments, the insulator 524 comprises a high dielectric constant material such as an oxide. In some embodiments, the insulator 524 has a thickness of between about 0.002 μm to about 2.0 μm. In some embodiments, the insulator 524 is formed by deposition. In some embodiments, the insulator 524 is removed, such as by at least one of CMP or dry etching, from the over the first mask 518 and the top surface 515 of the conductor 516, as illustrated in FIG. 41.

Figure 44:
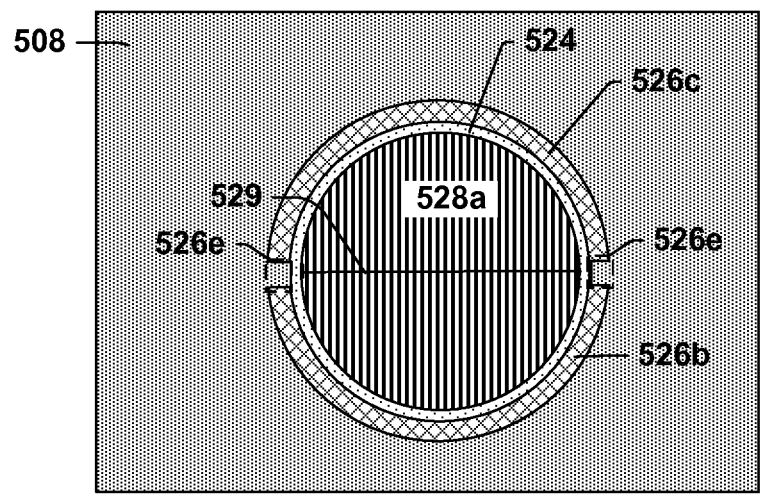
FIG. 44 is an illustration of a semiconductor device, in accordance with some embodiments.
Figure 45:
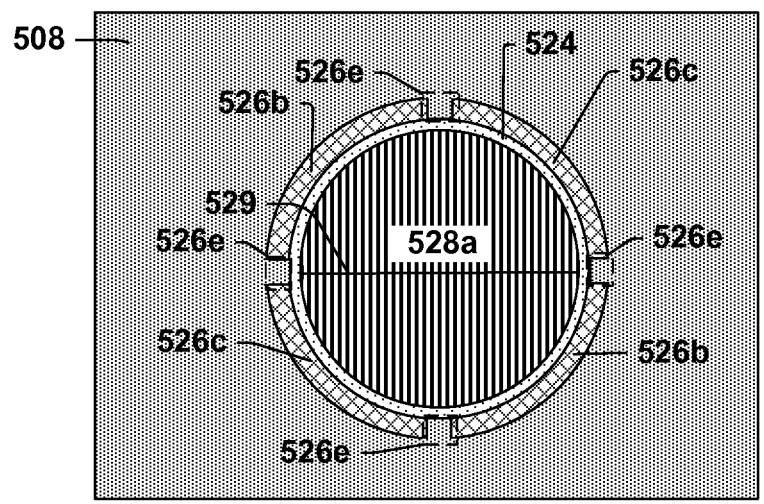
FIG. 45 is an illustration of a semiconductor device, in accordance with some embodiments.

At 308, a column 528 is formed in the first opening 514, such that the insulator 524 concentrically surrounds the column 528, as illustrated in FIG. 43, according to some embodiments. In some embodiments, the column 528 is configured as a column gate 528a, as illustrated in FIGS. 43-44. Turning to FIG. 43, a second conductive material 527 is formed, such as by deposition, in the first opening 514 and over the first mask 518. In some embodiments, the second conductive material 527 comprises at least one of polysilicon or metal, such as copper. In some embodiments, the excess second conductive material 527 and the first mask 518 are removed, such as by CMP to form the column gate 528a as illustrated in FIG. 43. In some embodiments, the column gate 528a is formed such that the column gate 528a is in contact with the conductor 516. In some embodiments, the column gate 528a has a column width 529 between about 0.5 μm to about 5.0 μm. Turning to FIG. 44, which illustrates a top down or overview of FIG. 43, according to some embodiments, where the top down or overview has a higher level of zoom than the side views, the first conductor portion 526 is configured as the conductor source 526b, the conductor drain 526c and the conductor channel 526e, such that the conductor channel 526e is between the conductor source 526b and the conductor drain 526c, concentrically surrounds the insulator 524, and the insulator 524 concentrically surrounds the column gate 528a. According to some embodiments, FIG. 44 illustrates the first portion of the conductor 526 as formed in FIG. 37. Turning to FIG. 45, which illustrates a top down or overview of FIG. 42, according to some embodiments, where the top down or overview has a higher level of zoom than the side views, the first conductor portion 526 concentrically surrounds the insulator 524, and the insulator 524 concentrically surrounds the column gate 528a. In some embodiments, the first conductor portion 526 is configured as a first conductor source 526b, a second conductor source 526b, a first conductor drain 526c, a second conductor drain 526c and conductor channels 526e, such that the conductor channels 526e are between the first conductor source 526b and the first conductor drain 526c and between the second conductor source 526b and the second conductor drain 526c. According to some embodiments, FIG. 45 illustrates the first portion of the conductor 526 as formed in FIG. 38. In some embodiments, the conductor 516 is connected to a power source (not shown), such that when a bias is applied to the column gate 528a, current flows through the first conductor portion 526.

Figure 4:
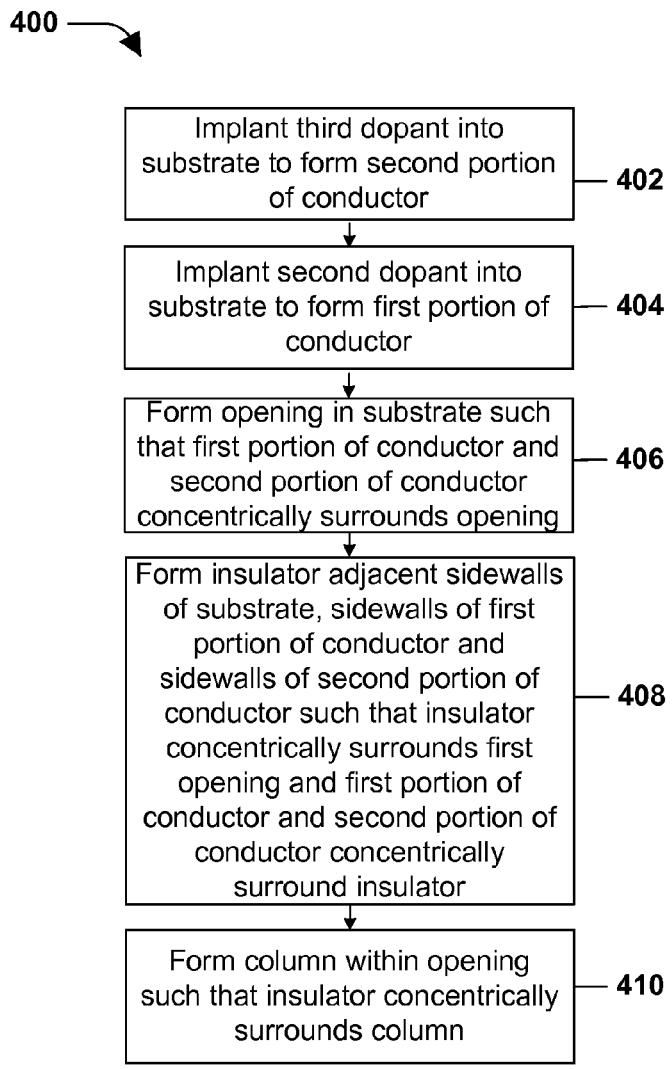
FIG. 4 is a flow diagram illustrating a method of forming a semiconductor device, in accordance with some embodiments.

A method 400 of forming a semiconductor device 500 according to some embodiments is illustrated in FIG. 4 and one or more structures formed thereby at various stages of fabrication are illustrated in FIGS. 46-53.

Figure 52:
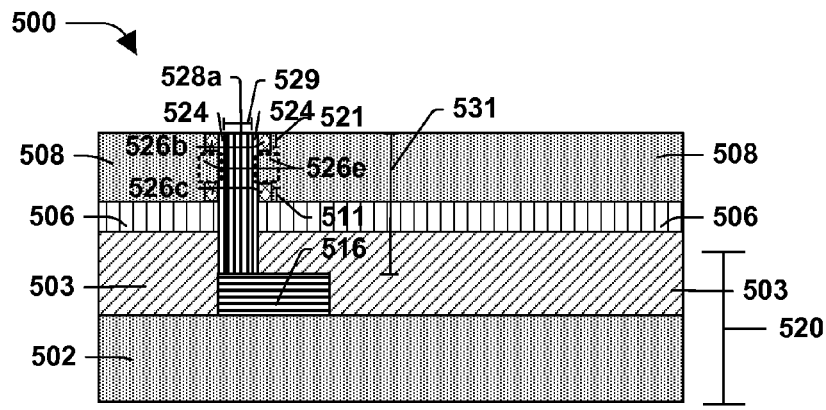
FIG. 52 is an illustration of a semiconductor device, in accordance with some embodiments.

In some embodiments, a semiconductor device 500 comprises a column 528, an insulator 524, a first portion of a conductor 526 and a second portion of the conductor 526, where the insulator 524 concentrically surrounds the column 528, the first portion of the conductor 526 concentrically surrounds the column 528 and the second portion of the conductor 526 concentrically surrounds the column 528, as illustrated in FIG. 52. In some embodiments, the column 528 is configured as a column gate 528a, the first portion of the conductor 526 is configured as at least one of a conductor source 526b or a conductor drain 526c and the second portion of the conductor 526 is configured as a conductor source 526b when the first portion of the conductor 526 is configured as a conductor drain 526c. In some embodiments, the second portion of the conductor 526 is configured as conductor drain 526c when the first portion of the conductor 526 is configured as a conductor source 526b, as illustrated in FIG. 52.

Figure 46:
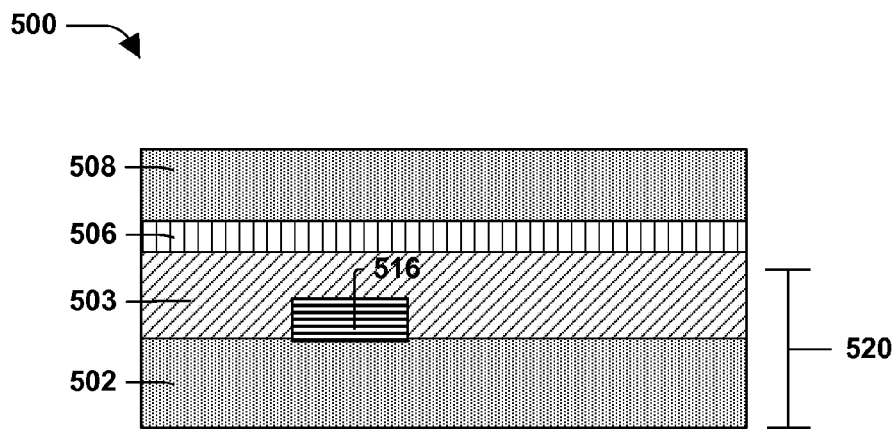
FIG. 46 is an illustration of a semiconductor device, in accordance with some embodiments.
Figure 47:
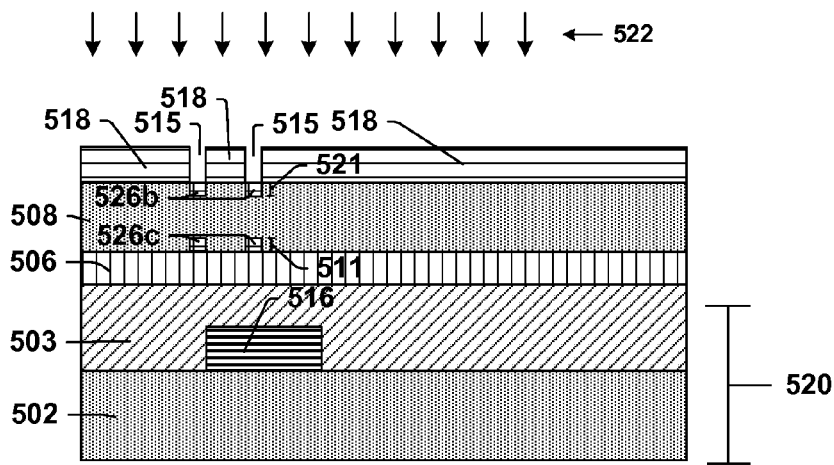
FIG. 47 is an illustration of a semiconductor device, in accordance with some embodiments.
Figure 48:
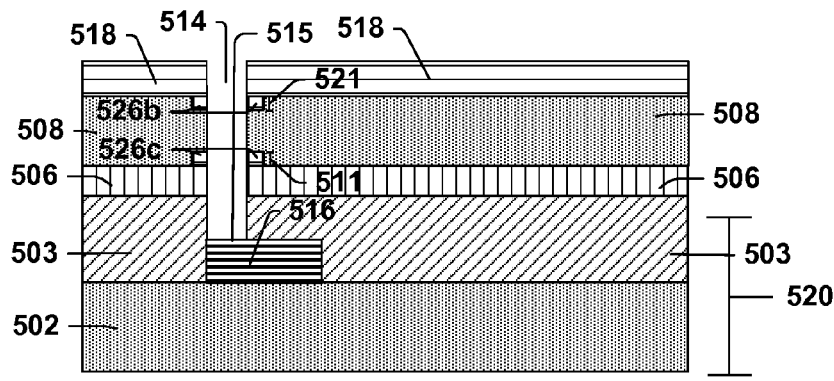
FIG. 48 is an illustration of a semiconductor device, in accordance with some embodiments.

At 402, a third dopant (not shown) is implanted into the substrate 508 to form the second portion of the conductor 526 configured as a conductor drain 526c, as illustrated in FIG. 47. Prior to FIG. 47, according to some embodiments, the base substrate 502, the first dielectric layer 503, the conductor 516, the glue layer 506, and the substrate 508 are illustrated in FIG. 46, and are formed as described above with regards to FIGS. 5-7, according to some embodiments. In some embodiments, the first mask 518 is formed over the substrate 508, such that the first mask 518 exposes a portion of the substrate 508 over the conductor 516, as illustrated in FIG. 47. In some embodiments, the third dopant is implanted into the exposed substrate 508. In some embodiments, the third dopant comprises at least one of p-type dopant, such as boron or an n-type dopant, such as phosphorus. In some embodiments, the third dopant implant forms at least one of a conductor source 526b, not shown, or a conductor drain 526c, as illustrated in FIG. 48. In some embodiment, the third implant is a deep implant, such as an implant having a high energy, such as an energy between about 100 keV to 500 keV. In some embodiments, the second portion of the conductor 526 configured as a column drain 526c has a second portion height 511.

At 404, a second dopant 530 is implanted into the substrate 508 to form the first portion of the conductor 526 configured as a conductor source 526b, as illustrated in FIG. 47. In some embodiments, the second dopant 530 is implanted into the substrate 508 over the second portion of the conductor 526. In some embodiments, the second dopant 530 comprises at least one of p-type dopant, such as boron or an n-type dopant, such as phosphorus. In some embodiments, the second dopant 530 implant forms at least one of a conductor source 526b, as illustrated in FIG. 47, or a conductor drain 526c, not shown. In some embodiment, the second dopant 530 is a shallow implant, such as an implant having a low energy, such as an energy between about 10 keV to 50 keV. In some embodiments, the first portion of the conductor configured as a column source 526b, has a first portion height 521.

At 406, a first opening 514 is formed in the substrate 508, such that the first portion of the conductor 526 surrounds the first opening 514 and such that the second portion of the conductor 526 surrounds the first opening 514, as illustrated in FIG. 48. In some embodiments, the first opening 514 is formed by etching. In some embodiments, the first opening 514 formation removes a portion of the first mask layer 518 over the conductor 516. In some embodiments, the first opening 514 exposes at least a portion of the top surface of the conductor 516. In some embodiments, the first opening 514 is concentrically surrounded by the first portion of the conductor 526, which is configured as a conductor source 526b. In some embodiments, the first opening 514 is concentrically surrounded by the second portion of the conductor 526, which is configured as the conductor drain 526c. In some embodiments, the first opening is concentrically surrounded by a conductor channel 526e, such that the conductor channel 526e is between the conductor source 526b and the conductor drain 526c.

Figure 49:
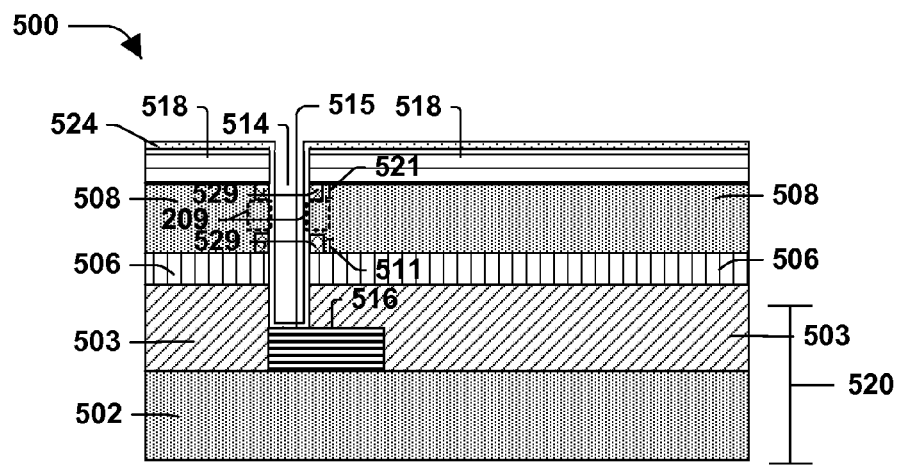
FIG. 49 is an illustration of a semiconductor device, in accordance with some embodiments.
Figure 50:
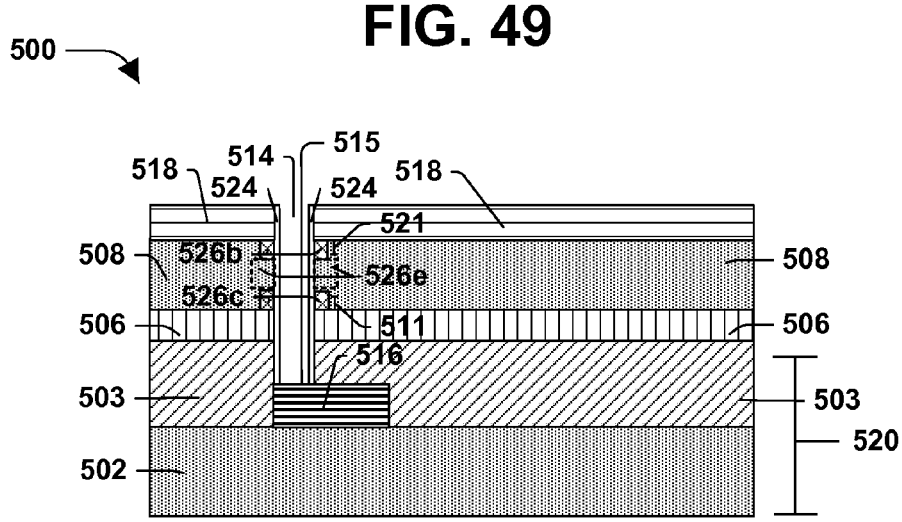
FIG. 50 is an illustration of a semiconductor device, in accordance with some embodiments.

At 408, an insulator 524 is formed adjacent sidewalls of the substrate 508, sidewalls of a first portion of the conductor 526 configured as a conductor source 526b and sidewalls of a second portion of the conductor 526 configured as a conductor drain 526c, such that the insulator 524 concentrically surrounds the first opening 514 and the first portion of conductor and the second portion of conductor concentrically surround the insulator 524, as illustrated in FIG. 50. Prior to FIG. 50, according to some embodiments, the insulator 524 is formed in the first opening 514, over the conductor drain 526c, the conductor source 526b, and the first mask 518, as illustrated in FIG. 49. In some embodiments, the insulator 524 comprises a high dielectric constant material such as an oxide. In some embodiments, the insulator 524 has a thickness of between about 0.002 µm to about 2.0 µm. In some embodiments, the insulator 524 is formed by deposition. In some embodiments, the insulator 524 is removed, such as by at least one of chemical mechanical planarization (CMP) or dry etching, from the over the first mask 518 and the top surface 515 of the conductor 516, as illustrated in FIG. 50.

Figure 51:
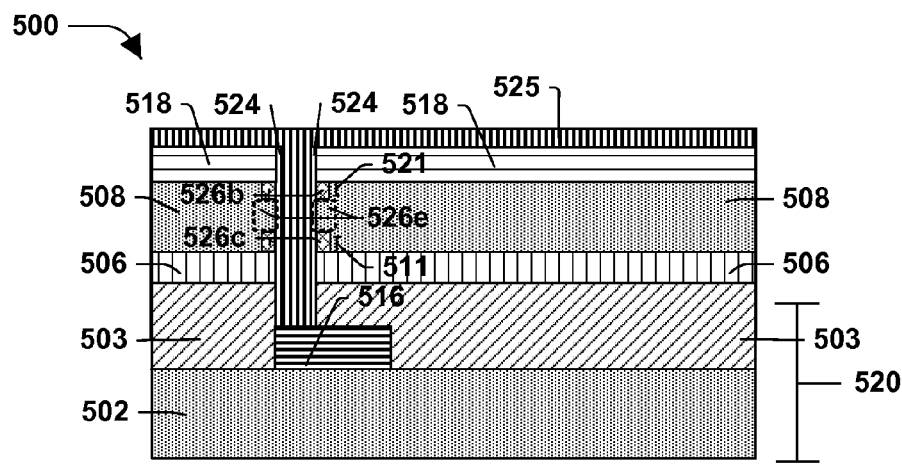
FIG. 51 is an illustration of a semiconductor device, in accordance with some embodiments.
Figure 53:
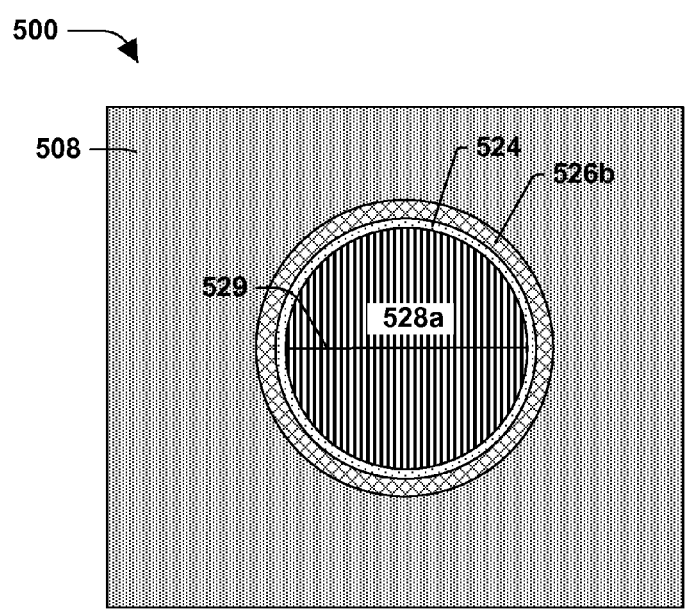
FIG. 53 is an illustration of a semiconductor device, in accordance with some embodiments.

At 410, a column 528 is formed in the first opening 514, such that the insulator 524 concentrically surrounds the column 528, as illustrated in FIG. 52, according to some embodiments. In some embodiments, the column 528 is configured as a column gate 528a, as illustrated in FIGS. 52-53. Prior to FIGS. 52-53, according to some embodiments, a second conductive material 525 is formed, such as by deposition, in the first opening 514 and over the first mask 518, as illustrated in FIG. 51. In some embodiments, the second conductive material 525 comprises at least one of polysilicon or metal, such as copper. In some embodiments, the excess second conductive material 525 and the first mask 518 are removed, such as by CMP to form the column gate 528a as illustrated in FIG. 52. In some embodiments, the column gate 528a is formed such that the column gate 528a is in contact with the conductor 516. In some embodiments, the column gate 528a has a column width 529 between about 0.5 µm to about 5.0 µm. In some embodiments, the column gate 528a has a column height 531, the column height 531 greater than a sum of the first portion height 521 and the second portion height 311. Turning to FIG. 53, which illustrates a top down or overview of FIG. 52, according to some embodiments, where the top down or overview has a higher level of zoom than the side views, the conductor source 526b over the conductor drain 526c concentrically surrounds the insulator 524, and the insulator 524 concentrically surrounds the column gate 528a. In some embodiments, the conductor 516 is connected to a power source (not shown), such that when a bias is applied to the column gate 528a, current flows from the column source 526b through the column channel 526e to the column drain 526c.

According to some embodiments, a semiconductor device comprises a column extending through a layer, an insulator concentrically surrounding the column, and a conductor concentrically surrounding the insulator. In some embodiments, the column is configured as at least one of a column source, a column drain, a column channel, a column gate, a column capacitive plate, or a column resistor. In some embodiments, the conductor is configured as at least one of a conductor source or a conductor drain when the column is configured as the column gate. In some embodiments, the conductor is configured as a conductor gate when the column is configured as at least one of the column source, the column drain, the column channel or the column resistor. In some embodiments, the conductor is configured as a conductor capacitive plate when the column is configured as the column capacitive plate.

According to some embodiments, a method of forming a semiconductor device comprises forming an first opening in a substrate and implanting a first dopant into sidewalls of the substrate defining the opening such that a conductor concentrically surrounds the opening, forming an insulator adjacent sidewalls of the conductor such that the insulator concentrically surrounds the opening, and forming a column within the opening such that the insulator concentrically surrounds the column. In some embodiments, a method of forming a semiconductor device comprises forming an first opening in a substrate and forming an insulator adjacent sidewalls of the substrate defining the opening such that the insulator concentrically surrounds the opening, implanting the first dopant into the sidewalls of the substrate such that a conductor concentrically surrounds the insulator and forming a column within the opening such that the insulator concentrically surrounds the column.

According to some embodiments, a method of forming a semiconductor device comprises implanting a second dopant into a substrate to form a first portion of a conductor, forming an opening in the substrate such that the first portion of the conductor concentrically surrounds the opening, forming an insulator adjacent sidewalls of the substrate defining the opening and adjacent sidewalls of the first portion of the conductor, such that the insulator concentrically surrounds the opening and the first portion of the conductor concentrically surrounds the insulator, and forming a column within the opening such that the insulator concentrically surrounds the column.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   a column extending through a dielectric;
   a first conductor in contact with the dielectric and in contact with a bottom surface of the column;
   an insulator concentrically surrounding the column; and
   a second conductor concentrically surrounding the insulator,
      the column configured as at least one of a column source, a column drain, a column channel, and
      the second conductor configured as a conductor gate.

2. The semiconductor device of claim 1, the column configured as the column source, the column drain and the column channel, where the column channel separates the column source from the column drain, and the second conductor configured as the conductor gate such that the semiconductor device comprises a transistor.

3. The semiconductor device of claim 1, the column configured as the column channel and the second conductor configured as the conductor gate such that the semiconductor device comprises a transistor.

4. The semiconductor device of claim 1 the column comprising at least one of a silicon, a polysilicon, a doped silicon or a doped polysilicon when the column is configured as at least one of the column source, the column drain, or the column channel.

5. The semiconductor device of claim 1, the second conductor comprising at least one of a doped silicon or a doped polysilicon when the second conductor is configured as the conductor gate.

6. The semiconductor device of claim 1, comprising a substrate concentrically surrounding the second conductor.

7. A semiconductor device comprising:
   a first conductor in contact with a first dielectric;
   a column extending through the first dielectric and in contact with the first conductor;
   an insulator concentrically surrounding the column; and
   a second conductor concentrically surrounding the insulator.

8. The semiconductor device of claim 7, comprising a substrate disposed above the first dielectric and wherein the substrate is in contact with the second conductor.

9. The semiconductor device of claim 8, the insulator in contact with the first dielectric.

10. The semiconductor device of claim 8, the second conductor extending a length of the substrate.

11. The semiconductor device of claim 7, the column comprising a first doped region and a second doped region, the first doped region separated from the second doped region by a substantially undoped region.

12. The semiconductor device of claim 11, the first doped region comprising a first source/drain region, the second doped region comprising a second source/drain region, and the substantially undoped region comprising a channel region.

13. The semiconductor device of claim 11, the first doped region in contact with the first conductor.

14. The semiconductor device of claim 11, the second conductor concentrically surrounding the substantially undoped region.

15. The semiconductor device of claim 11, the second conductor concentrically surrounding the second doped region.

16. The semiconductor device of claim 11, comprising a substrate disposed above the first dielectric and a top surface of the first doped region disposed below a plane in which a bottom surface of the substrate lies.

17. The semiconductor device of claim 11, the second conductor concentrically surrounding the substantially undoped region and the second doped region.

18. The semiconductor device of claim 7, the column comprising at least one of an undoped silicon or a low doped silicon to form a high resistivity region.

19. A semiconductor device comprising:
a first dielectric;
a first conductor in contact with the first dielectric;
a column extending through the first dielectric and in contact with a bottom surface of the first conductor;
an insulator concentrically surrounding the column; and
a second conductor concentrically surrounding the insulator.

20. The semiconductor device of claim 19, comprising a substrate concentrically surrounding the second conductor and in contact with the second conductor, the first dielectric in contact with the insulator.

* * * * *